(12) United States Patent
Shimase et al.

(10) Patent No.: US 12,340,504 B2
(45) Date of Patent: Jun. 24, 2025

(54) SEMICONDUCTOR INSPECTING METHOD AND SEMICONDUCTOR INSPECTING DEVICE

(71) Applicant: HAMAMATSU PHOTONICS K.K., Hamamatsu (JP)

(72) Inventors: Akira Shimase, Hamamatsu (JP); Xiangguang Mao, Hamamatsu (JP); Akihito Uchikado, Hamamatsu (JP)

(73) Assignee: HAMAMATSU PHOTONICS K.K., Hamamatsu (JP)

(*) Notice: Subject to any disclaimer, the term of this patent is extended or adjusted under 35 U.S.C. 154(b) by 382 days.

(21) Appl. No.: 17/925,625

(22) PCT Filed: Mar. 31, 2021

(86) PCT No.: PCT/JP2021/013840
§ 371 (c)(1),
(2) Date: Nov. 16, 2022

(87) PCT Pub. No.: WO2021/250984
PCT Pub. Date: Dec. 16, 2021

(65) Prior Publication Data
US 2023/0206422 A1  Jun. 29, 2023

(30) Foreign Application Priority Data

Jun. 8, 2020 (JP) ................. 2020-099463

(51) Int. Cl.
*G06T 7/00* (2017.01)
*G01R 31/308* (2006.01)
*G06V 10/764* (2022.01)

(52) U.S. Cl.
CPC ............ *G06T 7/001* (2013.01); *G01R 31/308* (2013.01); *G06V 10/764* (2022.01);
(Continued)

(58) Field of Classification Search
CPC ........... G06T 7/001; G06T 2207/10024; G06T 2207/20081; G06T 2207/20212;
(Continued)

(56) References Cited

U.S. PATENT DOCUMENTS 10,605,859 B2 * 3/2020 Salem ................ G01R 31/2891
2004/0103353 A1   5/2004 Koyama et al.
(Continued)

FOREIGN PATENT DOCUMENTS

JP    H10-332794 A   12/1998
JP    2007-003306 A   1/2007
(Continued)

OTHER PUBLICATIONS

International Preliminary Report on Patentability mailed Dec. 22, 2022 for PCT/JP2021/013840.
(Continued)

*Primary Examiner* — Samir A Ahmed
(74) *Attorney, Agent, or Firm* — Faegre Drinker Biddle & Reath LLP

(57) ABSTRACT

A semiconductor inspecting method according to an embodiment includes a step of scanning a semiconductor device with laser light to acquire characteristic information indicative of characteristics of an electrical signal of the semiconductor device in response to irradiation with the laser light for each of irradiation positions of the laser light and to generate a first pattern image of the semiconductor device based on characteristic information for each of irradiation positions, a step of generating a second pattern image of the semiconductor device based on a layout image of the semiconductor device and current path information indicative of a current path in the semiconductor device, and a step of acquiring matching information indicative of a relative relationship between the first pattern image and the layout (Continued)

image based on a result of positional alignment between the first pattern image and the second pattern image.

22 Claims, 15 Drawing Sheets

(52) U.S. Cl.
CPC .............. *G06T 2207/10024* (2013.01); *G06T 2207/20081* (2013.01); *G06T 2207/20212* (2013.01); *G06T 2207/30148* (2013.01)

(58) Field of Classification Search
CPC ........ G06T 2207/30148; G01R 31/308; G01R 31/311; G06V 10/764; G06V 10/443; H01L 22/20; H01L 22/12
See application file for complete search history.

(56) References Cited

U.S. PATENT DOCUMENTS

| | | | |
|---|---|---|---|
| 2007/0011519 A1* | 1/2007 | Takeda | G01N 21/956 714/724 |
| 2009/0196490 A1 | 8/2009 | Matsumiya | |
| 2010/0241374 A1* | 9/2010 | Nikaido | H01L 22/20 702/59 |
| 2015/0187058 A1 | 7/2015 | Hotta | |
| 2018/0074117 A1 | 3/2018 | Salem et al. | |
| 2018/0293346 A1 | 10/2018 | Cilingiroglu et al. | |
| 2019/0371682 A1 | 12/2019 | Suzuki et al. | |
| 2020/0050099 A1 | 2/2020 | Su et al. | |
| 2020/0160083 A1 | 5/2020 | Zhu et al. | |

FOREIGN PATENT DOCUMENTS

| | | |
|---|---|---|
| JP | 2010-190738 A | 9/2010 |
| KR | 10-2016-0028954 A | 3/2016 |
| TW | 201937163 A | 9/2019 |
| TW | 201946099 A | 12/2019 |
| WO | WO-2006/137415 A1 | 12/2006 |
| WO | WO-2015/098342 A1 | 7/2015 |
| WO | WO-2020/066177 A1 | 4/2020 |
| WO | WO-2020246150 A1 * 12/2020 ........... G06F 30/392 |

OTHER PUBLICATIONS

Booastanddoost Mahyar et al., "Photoelectric laser stimulation (PLS) based technique for design-debug of analog circuits", 2017 IEEE 24th International Symposium on the Physical and Failure Analysis of Integrated Circuits (IPFA), IEEE, Jul. 4, 2017, p. 1-p. 5, XP033162943.

* cited by examiner

SEMICONDUCTOR INSPECTING METHOD AND SEMICONDUCTOR INSPECTING DEVICE

TECHNICAL FIELD

The present disclosure relates to a semiconductor inspecting method and a semiconductor inspecting device.

BACKGROUND ART

In the related art, a technology of performing failure analysis and the like on the basis of an image of a semiconductor device that is a device under test (DUT) is known. For example, Patent Document 1 and Patent Document 2 disclose that an optical image obtained by capturing an image of reflected light from a semiconductor device is acquired as a pattern image showing a pattern of the semiconductor device, and positional alignment between the pattern image and a layout image (design image) such as a CAD image showing a layout of the semiconductor device is performed. When such positional alignment is performed, for example, it is possible to obtain a superimposed image in which a failure analysis image of the semiconductor device obtained by an inspecting device (for example, a luminescent image showing a failure location of the semiconductor device by means of luminescence or the like) and a layout image of the semiconductor device are superimposed. Utilizing such a superimposed image facilitates failure analysis with respect to the semiconductor device.

CITATION LIST

Patent Document

[Patent Document 1] Japanese Unexamined Patent Publication No. 2007-003306
[Patent Document 2] PCT International Publication No. WO2015/098342

SUMMARY OF INVENTION

Technical Problem

However, recently, patterns of semiconductor devices have been micronized, and thus it is difficult to obtain an optical image capable of recognizing a pattern of a semiconductor device with high accuracy. For this reason, it may be difficult to accurately perform positional alignment between a pattern image obtained from a semiconductor device and a layout image.

Hence, an object of an aspect of the present disclosure is to provide a semiconductor inspecting method and a semiconductor inspecting device capable of accurately performing positional alignment between a pattern image obtained from a semiconductor device and a layout image of the semiconductor device.

Solution to Problem

A semiconductor inspecting method according to an aspect of the present disclosure includes: scanning a semiconductor device with light to acquire characteristic information indicative of characteristics of an electrical signal of the semiconductor device in response to irradiation with the light for each of irradiation positions of the light and to generate a first pattern image of the semiconductor device based on the characteristic information for each of the irradiation positions; generating a second pattern image of the semiconductor device based on a layout image showing a layout of the semiconductor device and current path information indicative of a current path in the semiconductor device; and acquiring matching information indicative of a relative relationship between the first pattern image and the layout image based on a result of positional alignment between the first pattern image and the second pattern image.

It is known that light (for example, laser light) for irradiation of a semiconductor device has a certain width and a full width at half maximum (FWHM) of reflected light from the semiconductor device is larger than a full width at half maximum of incident light on the semiconductor device. Here, a resolution of an optical image acquired on the basis of reflected light depends on the full width at half maximum of the observed reflected light. In contrast, a resolution of the first pattern image which is not based on reflected light depends on the full width at half maximum of incident light on the semiconductor device. In addition, as the full width at half maximum of light decreases, the resolution of an obtained image decreases. Therefore, it is possible to obtain an image having a higher resolution than an optical image acquired on the basis of reflected light by generating the first pattern image on the basis of the characteristics of an electrical signal of the semiconductor device in response to irradiation with the light. Moreover, it is possible to obtain highly accurate matching information between the first pattern image and the layout image on the basis of a result of positional alignment between the first pattern image and the second pattern image obtained on the basis of the layout image and the current path in the semiconductor device. As above, according to the foregoing semiconductor inspecting method, it is possible to accurately perform positional alignment between the pattern image (first pattern image) obtained from the semiconductor device and the layout image of the semiconductor device.

The generating the second pattern image may include: first processing of classifying at least one of at least a part of a diffusion layer and at least a part of an element isolation layer included in the semiconductor device based on the current path information and setting a color corresponding to the classification with respect to the at least one of the at least a part of the diffusion layer and the at least a part of the element isolation layer in the layout image; and second processing of generating the second pattern image based on a colored image generated through the first processing. According to the foregoing constitution, it is possible to obtain the second pattern image capable of accurately performing positional alignment with the first pattern image based on the colored image colored on the basis of the current path information.

The second processing may include blurring processing with respect to the colored image. According to the foregoing constitution, it is possible to obtain the second pattern image similar to the first pattern image through the blurring processing. As a result, it is possible to obtain the second pattern image capable of accurately performing positional alignment with the first pattern image.

The second processing may include: learning conversion processing of the colored image through machine learning using training data including the colored image for learning and the first pattern image corresponding to the colored image for learning; and generating the second pattern image by converting the colored image using the conversion processing determined through the learning. According to the foregoing constitution, it is possible to obtain the second pattern image similar to the first pattern image through the conversion processing based on a result of the machine learning. As a result, it is possible to accurately perform positional alignment between the first pattern image and the second pattern image.

The acquiring the matching information may include: presenting the first pattern image and the second pattern image to a user; and acquiring the matching information based on information indicative of a corresponding relationship between the first pattern image and the second pattern image designated by the user. According to the foregoing constitution, it is possible for a user to perform visually observed positional alignment between the first pattern image and the second pattern image.

The acquiring the matching information may include: learning processing of positional alignment between the first pattern image and the second pattern image through machine learning using training data including the first pattern image for learning, the second pattern image corresponding to the first pattern image for learning, and a matching result of the images; and acquiring the matching information by performing positional alignment between the first pattern image and the second pattern image using the processing of positional alignment determined through the learning. According to the foregoing constitution, it is possible to accurately perform positional alignment between the first pattern image and the second pattern image through the processing of positional alignment based on a result of the machine learning.

The semiconductor inspecting method may further include generating a superimposed image in which the layout image and the first pattern image are superimposed based on the matching information. According to the foregoing constitution, it is possible to obtain a superimposed image in which the layout image and the first pattern image are accurately superimposed based on the matching information. As a result, it is possible to accurately perform failure analysis and the like using the superimposed image.

The semiconductor inspecting method may further include identifying a failure position identified through failure analysis with respect to the semiconductor device and a position on the layout image based on the matching information, or setting a position of probing with respect to the semiconductor device based on the matching information. According to the foregoing constitution, it is possible to accurately perform failure analysis (identifying a failure position on the layout image or setting a probing position) by using the matching information.

In generating the first pattern image, a measurement value of an optical beam induced current generated in response to irradiation of the semiconductor device with light may be acquired as the characteristic information. According to the foregoing constitution, it is possible to obtain an optical beam induced current (OBIC) image, in which a hue (shade) corresponding to the measurement value of the optical beam induced current is set, as the first pattern image.

The semiconductor device may have a semiconductor substrate having a main surface with a transistor formed thereon and a rear surface on a side opposite to the main surface. In generating the first pattern image, the rear surface of the semiconductor substrate may be irradiated with the light transmitted from the rear surface to the main surface. The light may have an energy greater than a bandgap of a material of the semiconductor substrate. According to the foregoing constitution, it is possible to favorably generate an OBIC by causing single photon absorption (SPA) in the transistor on a main surface side of the semiconductor substrate.

The semiconductor device may have a semiconductor substrate having a main surface with a transistor formed thereon and a rear surface on a side opposite to the main surface. In generating the first pattern image, the rear surface of the semiconductor substrate may be irradiated with the light that is pulse light transmitted from the rear surface to the main surface. The light may have an energy smaller than a bandgap of a material of the semiconductor substrate. According to the foregoing constitution, it is possible to favorably generate an OBIC by causing multi photon absorption (MPA) in the transistor on a main surface side of the semiconductor substrate.

A semiconductor inspecting device according to another aspect of the present disclosure includes: a light source; a scanning unit configured to scan a semiconductor device with light from the light source; a measurement unit configured to be electrically connected to the semiconductor device and measure characteristics of an electrical signal of the semiconductor device in response to irradiation with the light for each of irradiation positions of the light; a first generation unit configured to generate a first pattern image of the semiconductor device based on characteristic information indicative of characteristics of the electrical signal for each of the irradiation positions measured by the measurement unit; a second generation unit configured to generate a second pattern image of the semiconductor device based on a layout image showing a layout of the semiconductor device and current path information indicative of a current path in the semiconductor device; and a processing unit configured to acquire matching information indicative of a relative relationship between the first pattern image and the layout image based on a result of positional alignment between the first pattern image and the second pattern image.

According to the foregoing semiconductor inspecting device, it is possible to favorably execute the semiconductor inspecting method described above.

The second generation unit may execute: first processing of classifying at least one of at least a part of a diffusion layer and at least a part of an element isolation layer included in the semiconductor device based on the current path information and setting a color corresponding to the classification with respect to the at least one of the at least a part of the diffusion layer and the at least a part of the element isolation layer in the layout image; and second processing of generating the second pattern image based on a colored image generated through the first processing. According to the foregoing constitution, it is possible to obtain the second pattern image capable of allowing accurate performing of positional alignment with the first pattern image based on the colored image colored on the basis of the current path information.

The second processing may include blurring processing with respect to the colored image. According to the foregoing constitution, it is possible to obtain the second pattern image similar to the first pattern image through the blurring processing. As a result, it is possible to obtain the second pattern image capable of allowing accurate performing of positional alignment with the first pattern image.

The second processing may execute: learning conversion processing of the colored image through machine learning using training data including the colored image for learning and the first pattern image corresponding to the colored image for learning; and generating the second pattern image by converting the colored image using the conversion processing determined through the learning. According to the foregoing constitution, it is possible to obtain the second pattern image similar to the first pattern image through the conversion processing based on a result of the machine learning. As a result, it is possible to accurately perform positional alignment between the first pattern image and the second pattern image.

The processing unit may execute: presenting the first pattern image and the second pattern image to a user; and acquiring the matching information based on information indicative of a corresponding relationship between the first pattern image and the second pattern image designated by the user. According to the foregoing constitution, it is possible for a user to perform visually observed positional alignment between the first pattern image and the second pattern image.

The processing unit may execute: learning processing of positional alignment between the first pattern image and the second pattern image through machine learning using training data including the first pattern image for learning, the second pattern image corresponding to the first pattern image for learning, and a matching result of the images; and acquiring the matching information by performing positional alignment between the first pattern image and the second pattern image using the processing of positional alignment determined through the learning. According to the foregoing constitution, it is possible to accurately perform positional alignment between the first pattern image and the second pattern image through the processing of positional alignment based on a result of the machine learning.

The processing unit may generate a superimposed image in which the layout image and the first pattern image are superimposed based on the matching information. According to the foregoing constitution, it is possible to obtain a superimposed image in which the layout image and the first pattern image are accurately superimposed based on the matching information. As a result, it is possible to accurately perform failure analysis and the like using the superimposed image.

The processing unit may identify a failure position identified through failure analysis with respect to the semiconductor device and a position on the layout image based on the matching information, or set a position of probing with respect to the semiconductor device based on the matching information. According to the foregoing constitution, it is possible to accurately perform failure analysis (identifying a failure position on the layout image or setting a probing position) by using the matching information.

The measurement unit may acquire a measurement value of an optical beam induced current generated in response to irradiation of the semiconductor device with light as the characteristic information. According to the foregoing constitution, it is possible to obtain an optical beam induced current (OBIC) image, in which a hue (shade) corresponding to the measurement value of the optical beam induced current is set, as the first pattern image.

The semiconductor device may have a semiconductor substrate having a main surface with a transistor formed thereon and a rear surface on a side opposite to the main surface. The scanning unit may scan the rear surface of the semiconductor substrate with the light transmitted from the rear surface to the main surface. The light may have an energy greater than a bandgap of a material of the semiconductor substrate. According to the foregoing constitution, it is possible to favorably generate an OBIC by causing single photon absorption (SPA) in the transistor on a main surface side of the semiconductor substrate.

The semiconductor device may have a semiconductor substrate having a main surface with a transistor formed thereon and a rear surface on a side opposite to the main surface. The scanning unit may scan the rear surface of the semiconductor substrate with the light that is pulse light transmitted from the rear surface to the main surface. The light may have an energy smaller than a bandgap of a material of the semiconductor substrate. According to the foregoing constitution, it is possible to favorably generate an OBIC by causing multi photon absorption (MPA) in the transistor on a main surface side of the semiconductor substrate.

Advantageous Effects of Invention

According to the aspect of the present disclosure, it is possible to provide a semiconductor inspecting method and a semiconductor inspecting device capable of accurately performing positional alignment between a pattern image obtained from a semiconductor device and a layout image of the semiconductor device.

Figure 3:
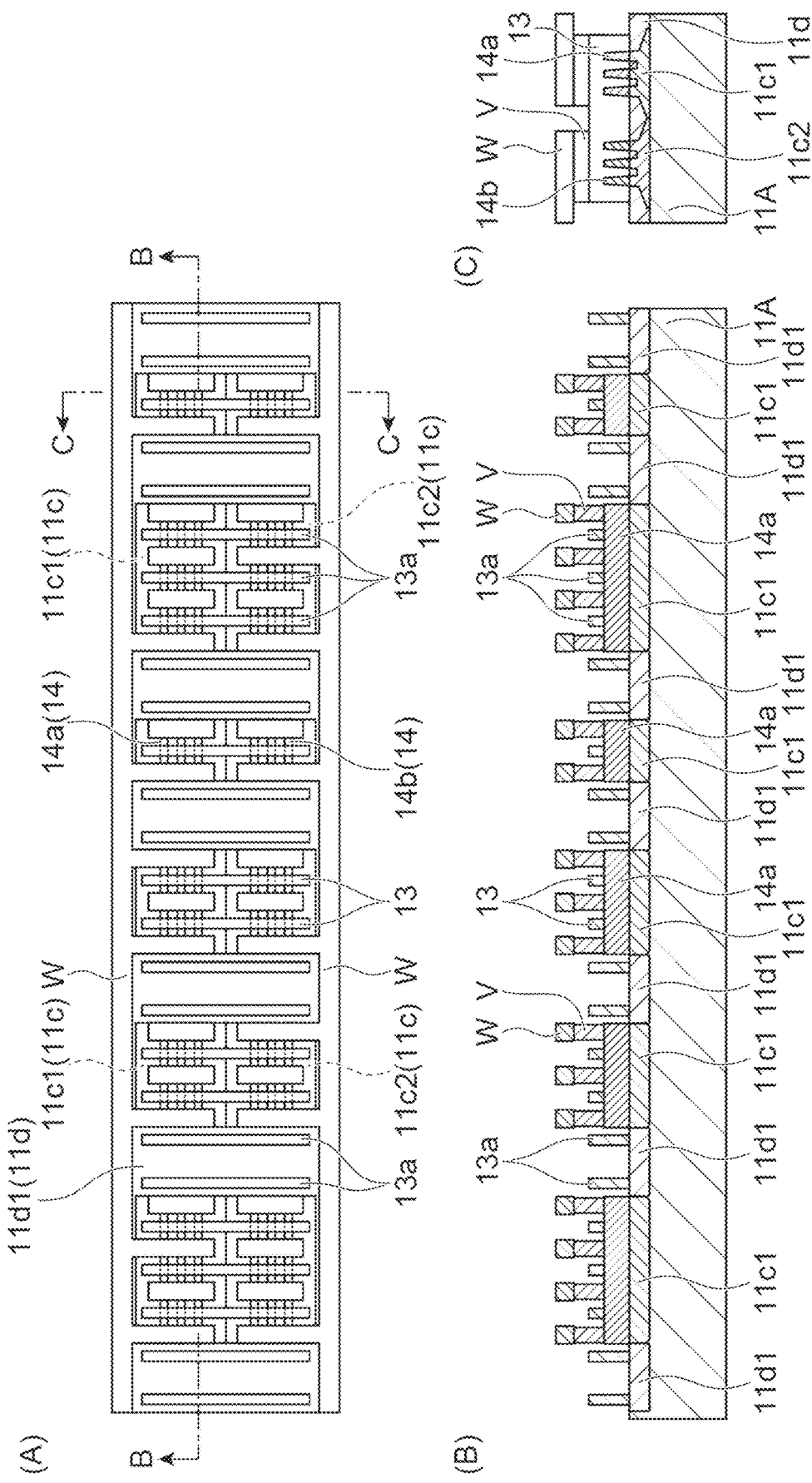

(A) and (B) of FIG. 3 are schematic views illustrating an example of a layout of a part of the semiconductor device.

Figure 4:
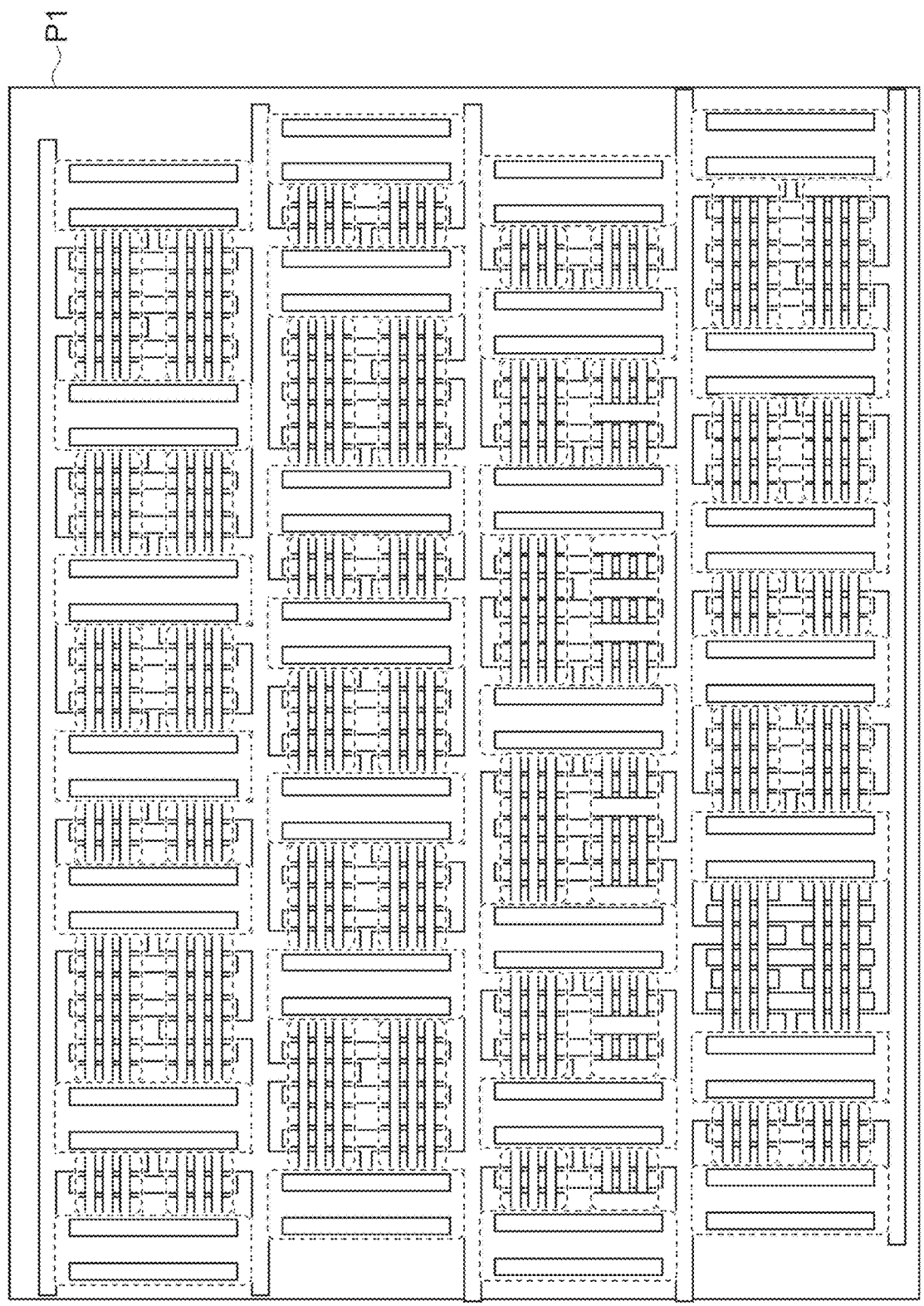

FIG. 4 is a view illustrating an example of a layout image.

Figure 5:
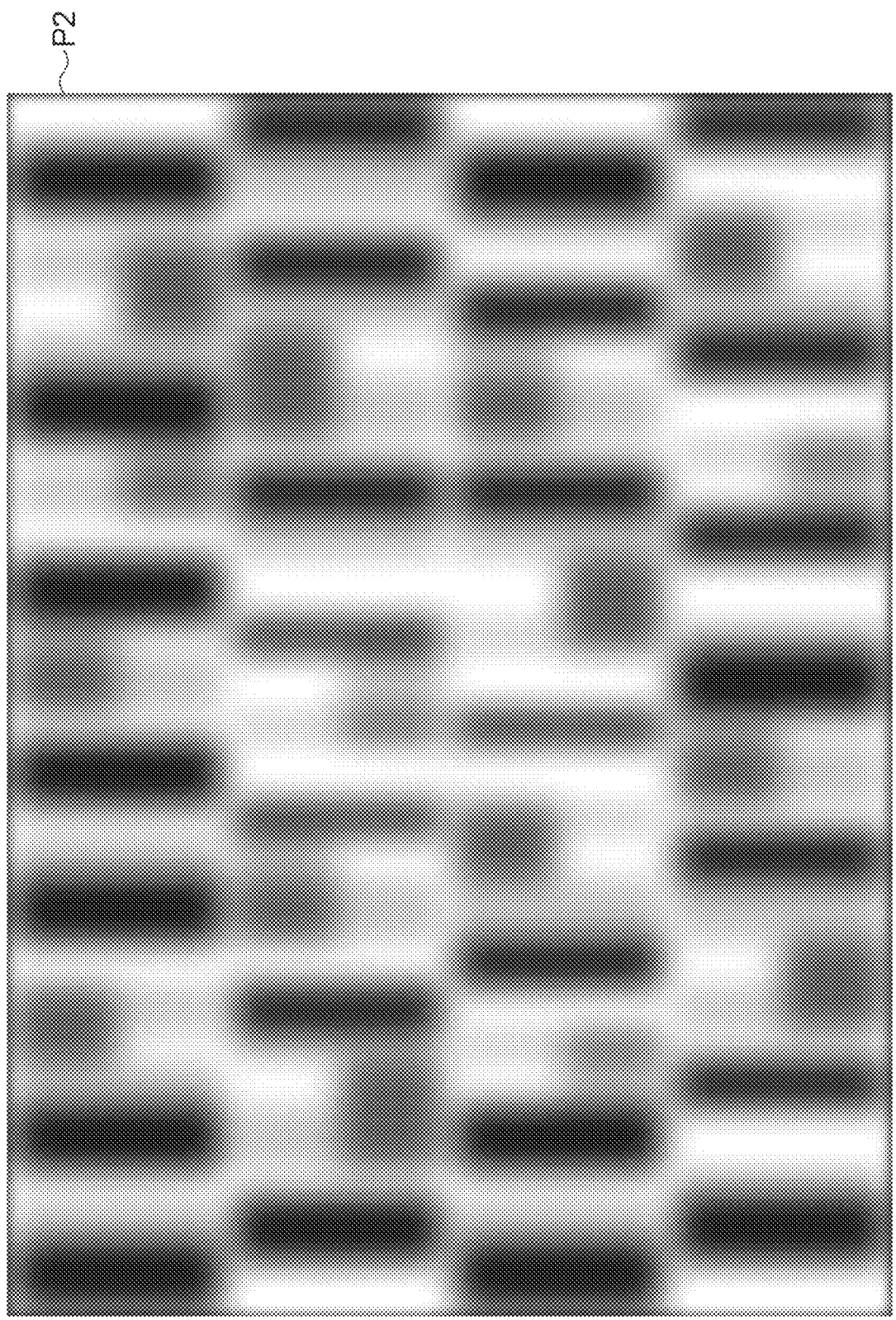

FIG. 5 is a view illustrating an example of an OBIC image (first pattern image).

Figure 6:
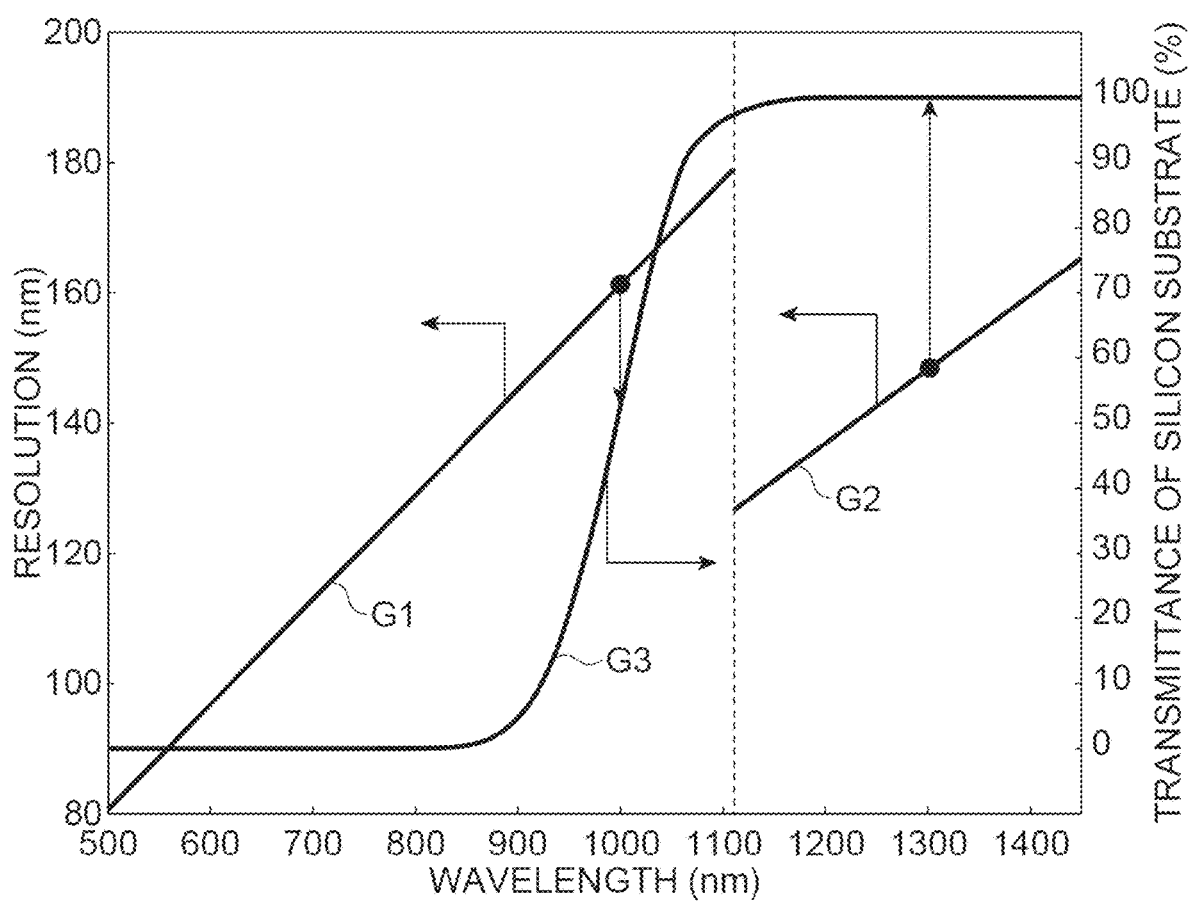

FIG. 6 is a graph showing a relationship between a wavelength of laser light and a resolution of an OBIC image, and a relationship between the wavelength of laser light and a transmittance of a silicon substrate.

Figure 7:
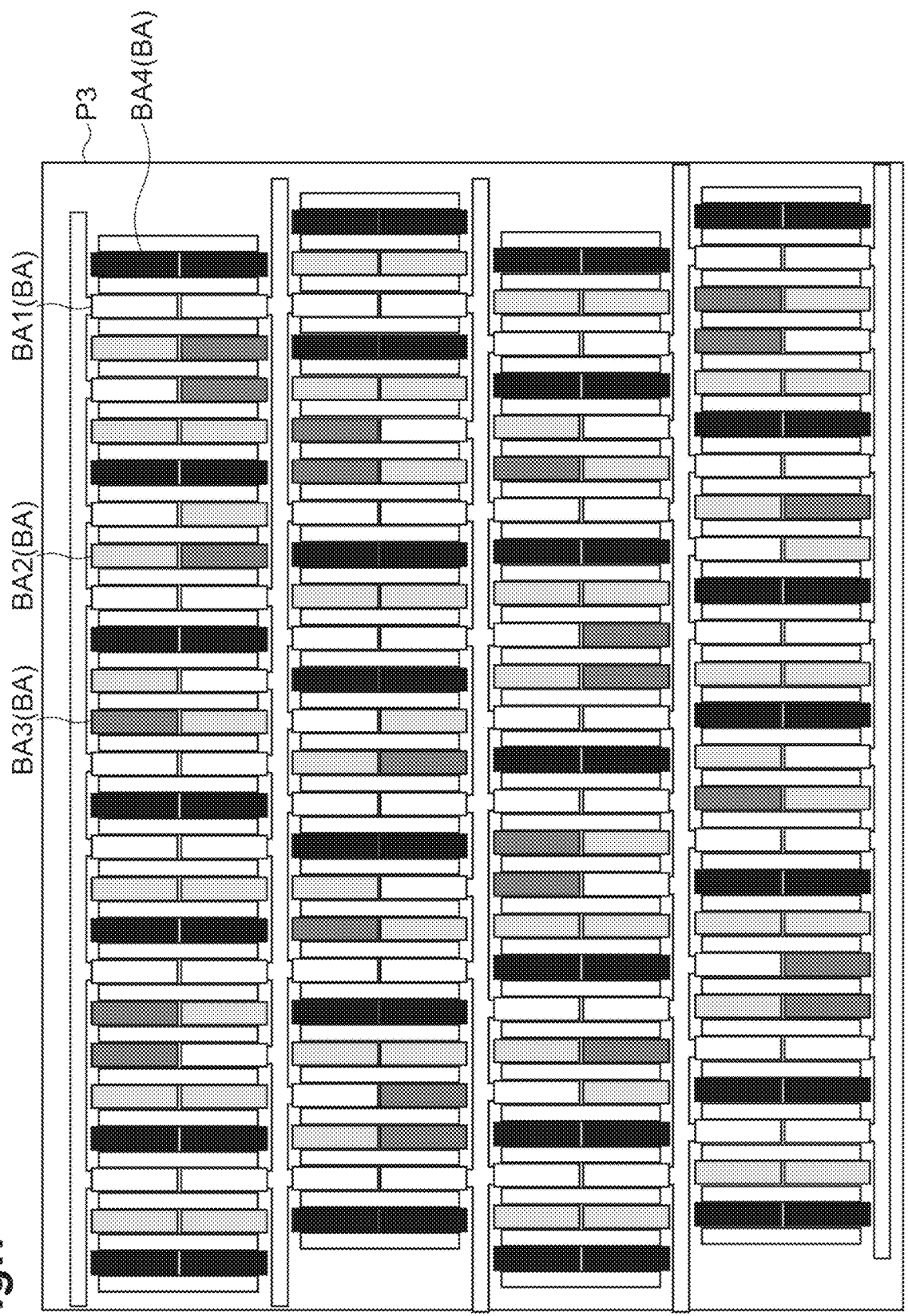

FIG. 7 is a view illustrating an example of a box setting image.

Figure 8:
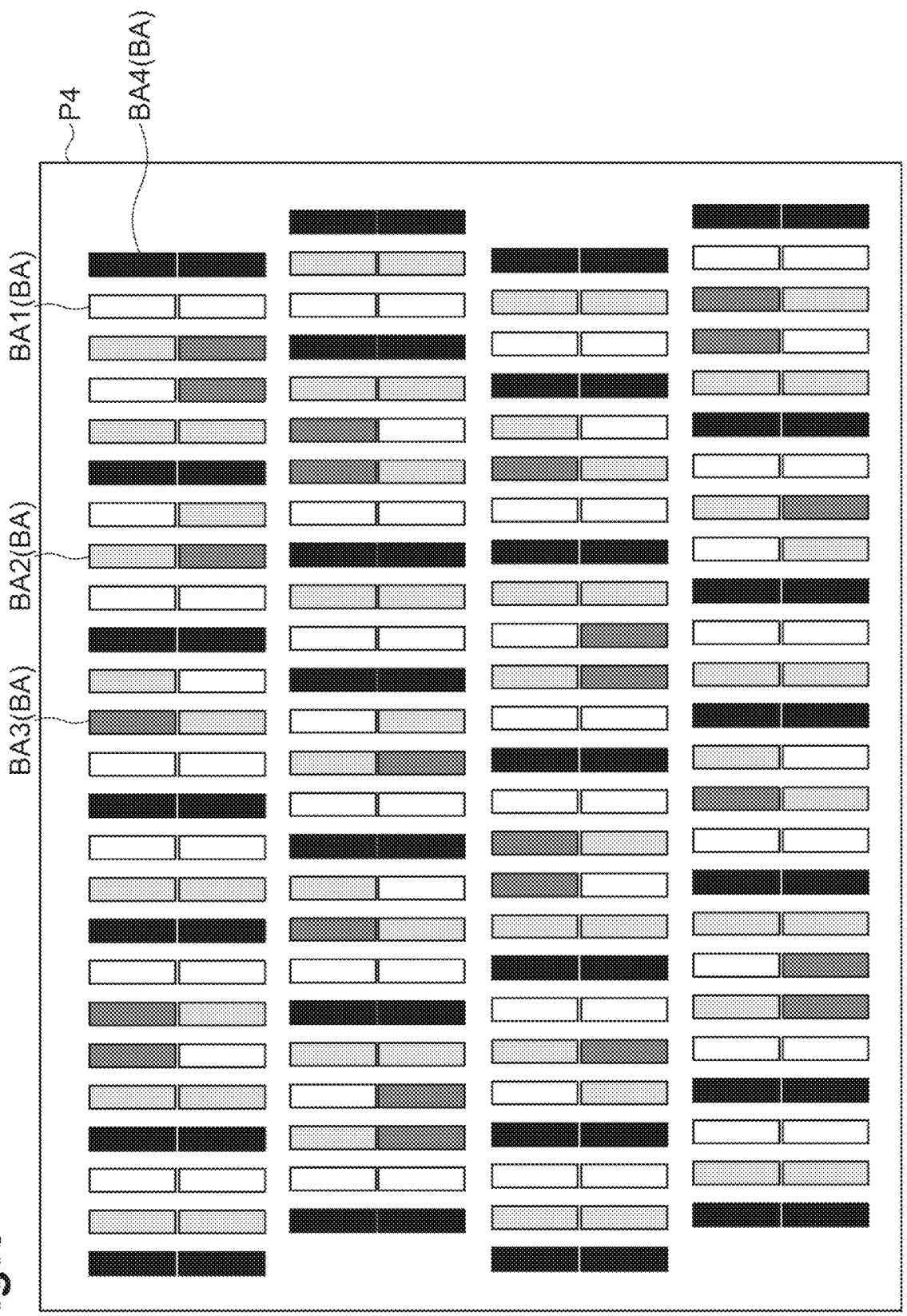

FIG. 8 is a view illustrating an example of a colored image.

Figure 9:
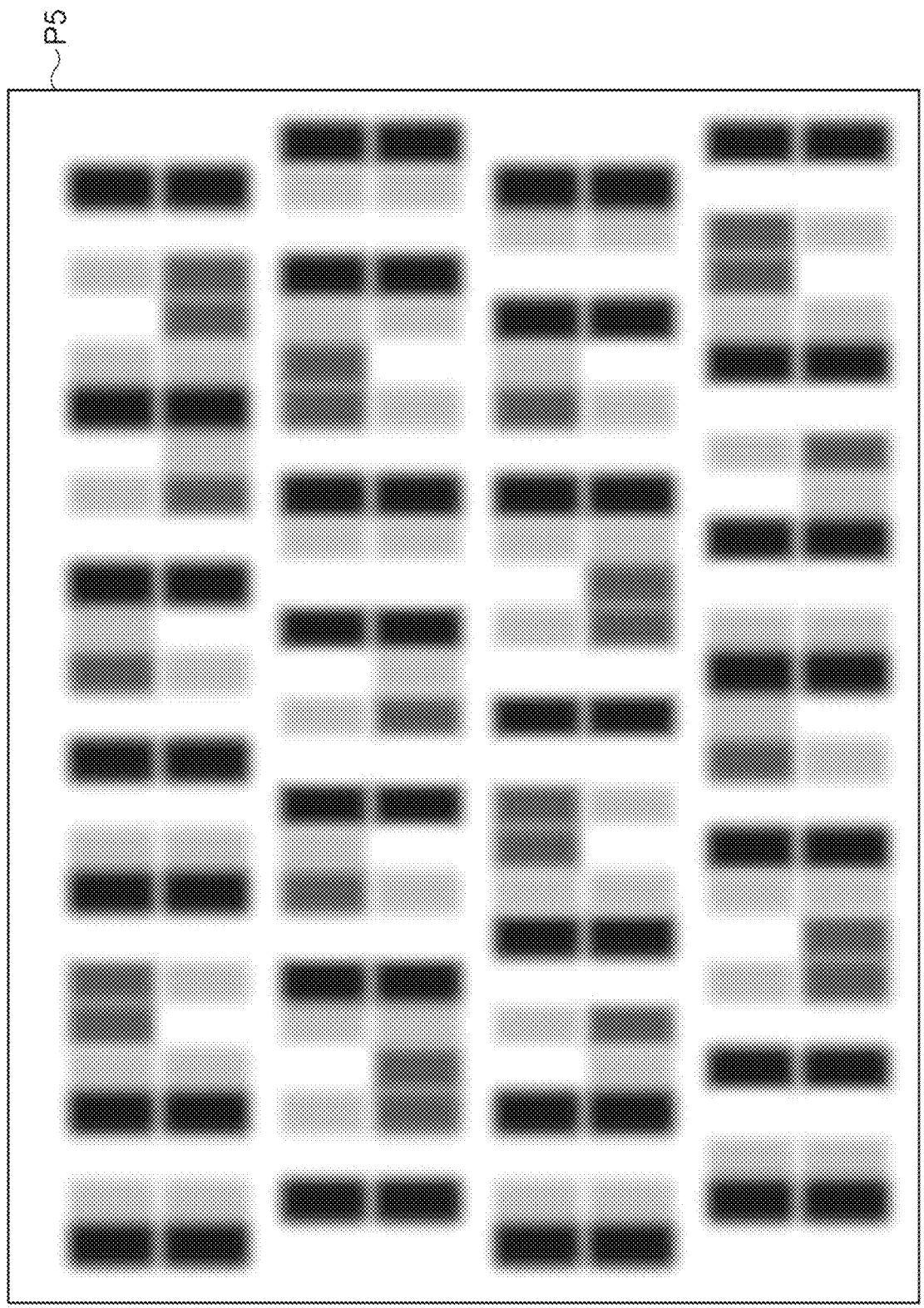

FIG. 9 is a view illustrating an example of a blurred image (second pattern image).

Figure 10:
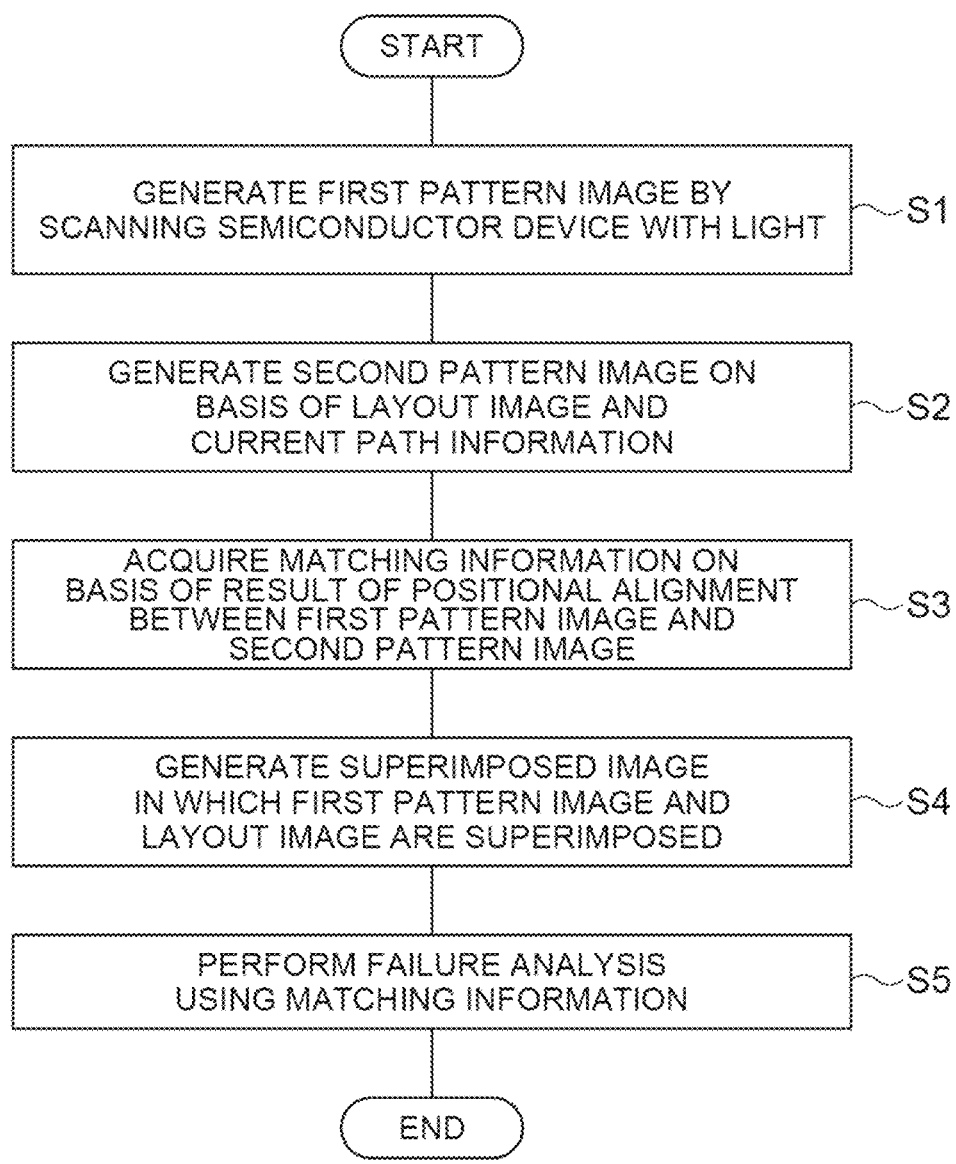

FIG. 10 is a flowchart showing an example of operation of the semiconductor inspecting device.

Figure 11:
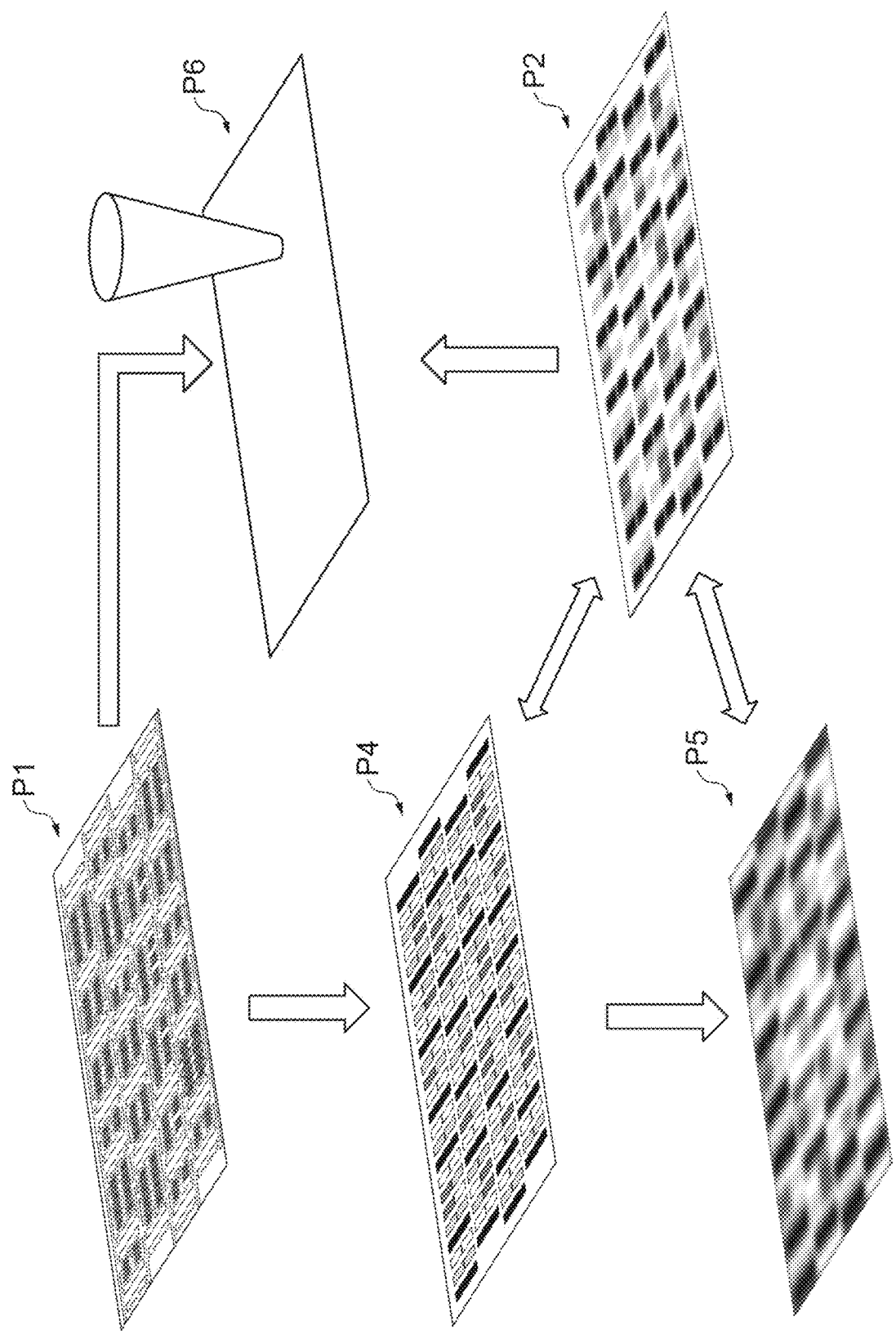

FIG. 11 is a view illustrating a relationship between images generated by the semiconductor inspecting device.

Figure 12:
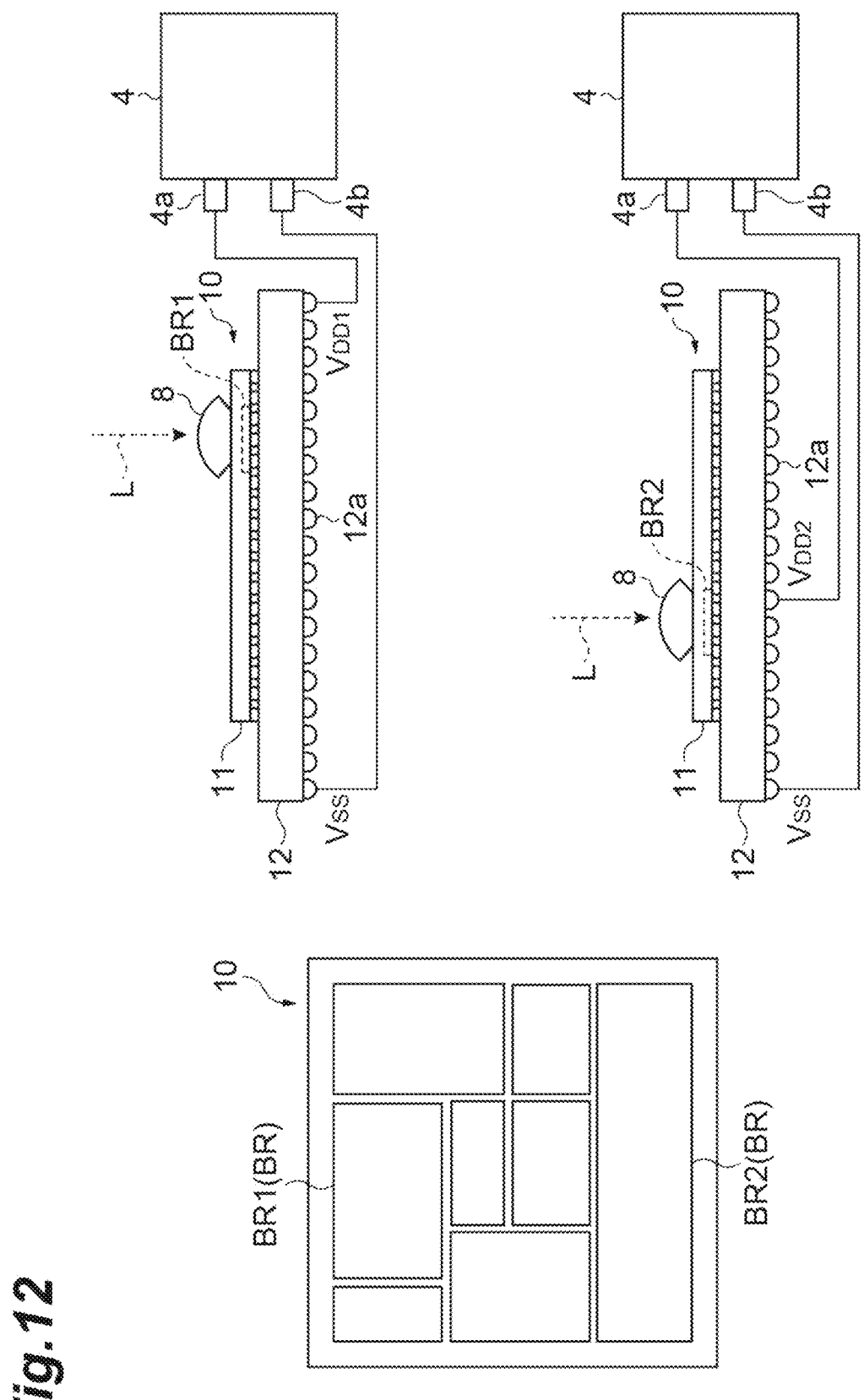

FIG. 12 is a schematic view illustrating a first constitutional example for acquiring an OBIC signal.

Figure 13:
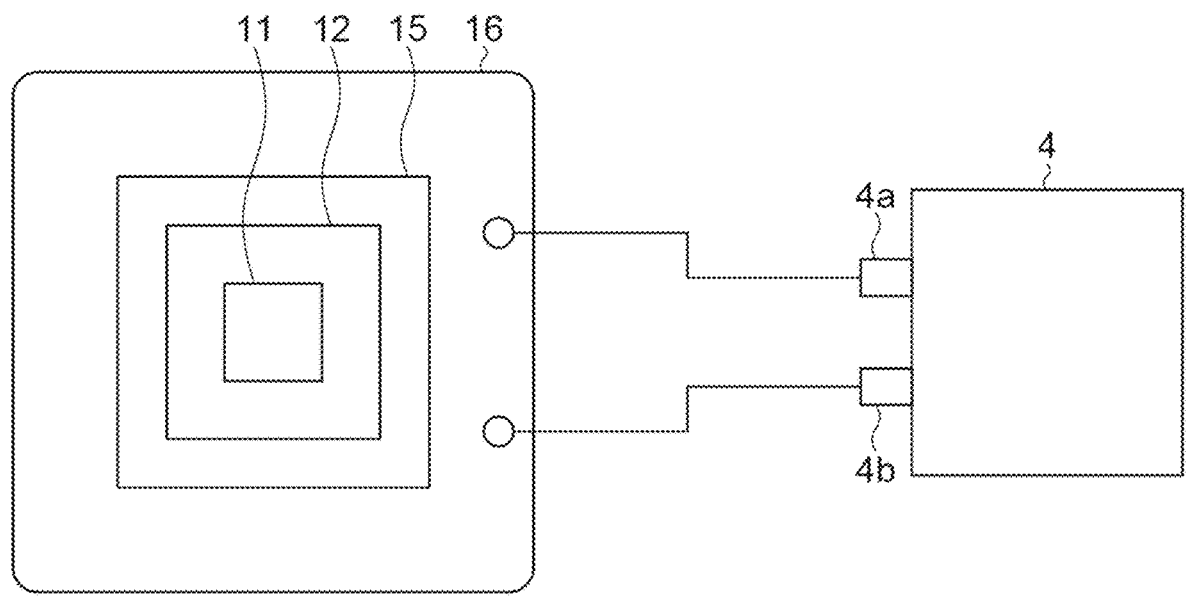

FIG. 13 is a schematic view illustrating a second constitutional example for acquiring an OBIC signal.

Figure 14:
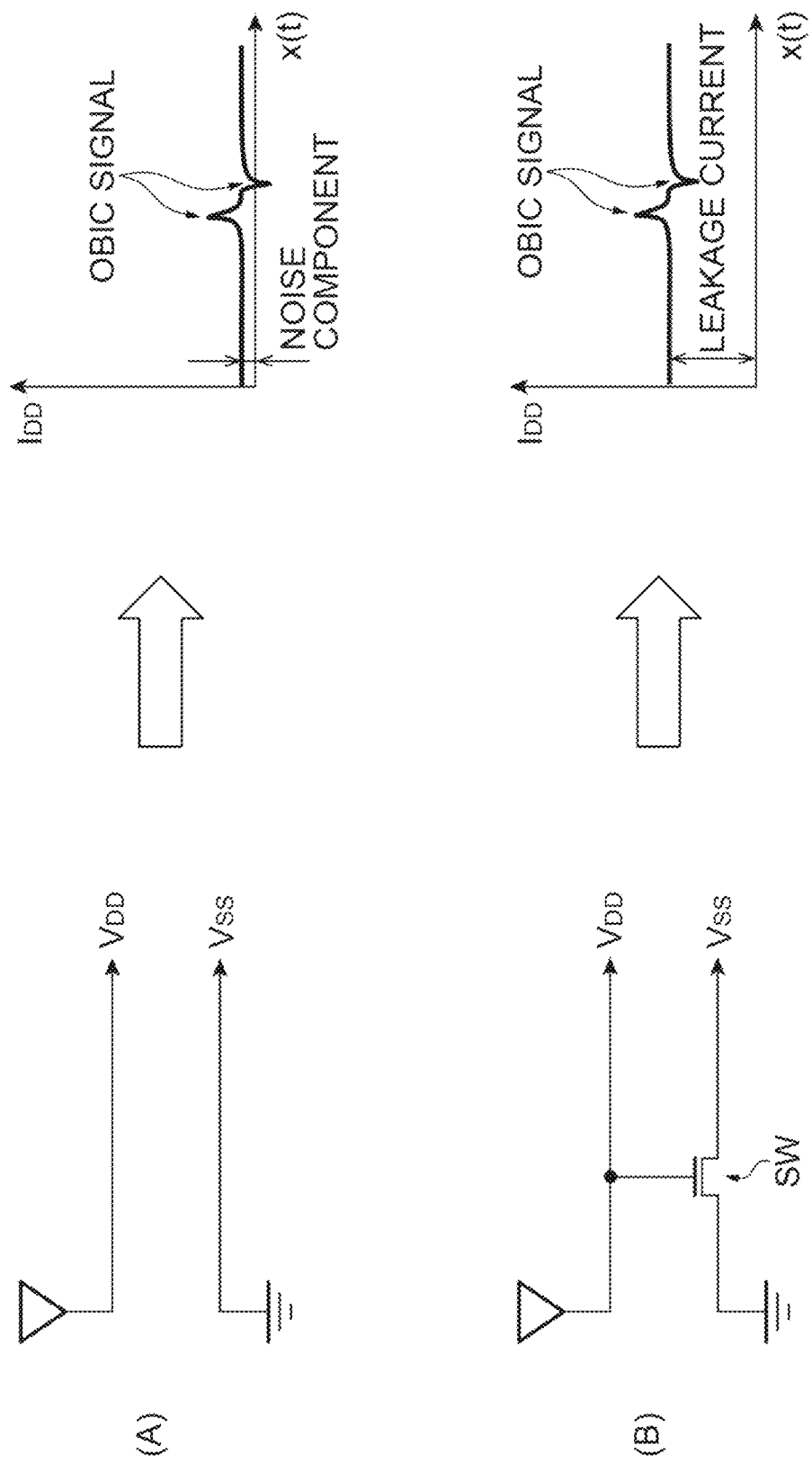

(A) of FIG. 14 is a schematic view illustrating a third constitutional example for acquiring an OBIC signal, and (B) of FIG. 14 is a schematic view illustrating a fourth constitutional example for acquiring an OBIC signal.

Figure 15:
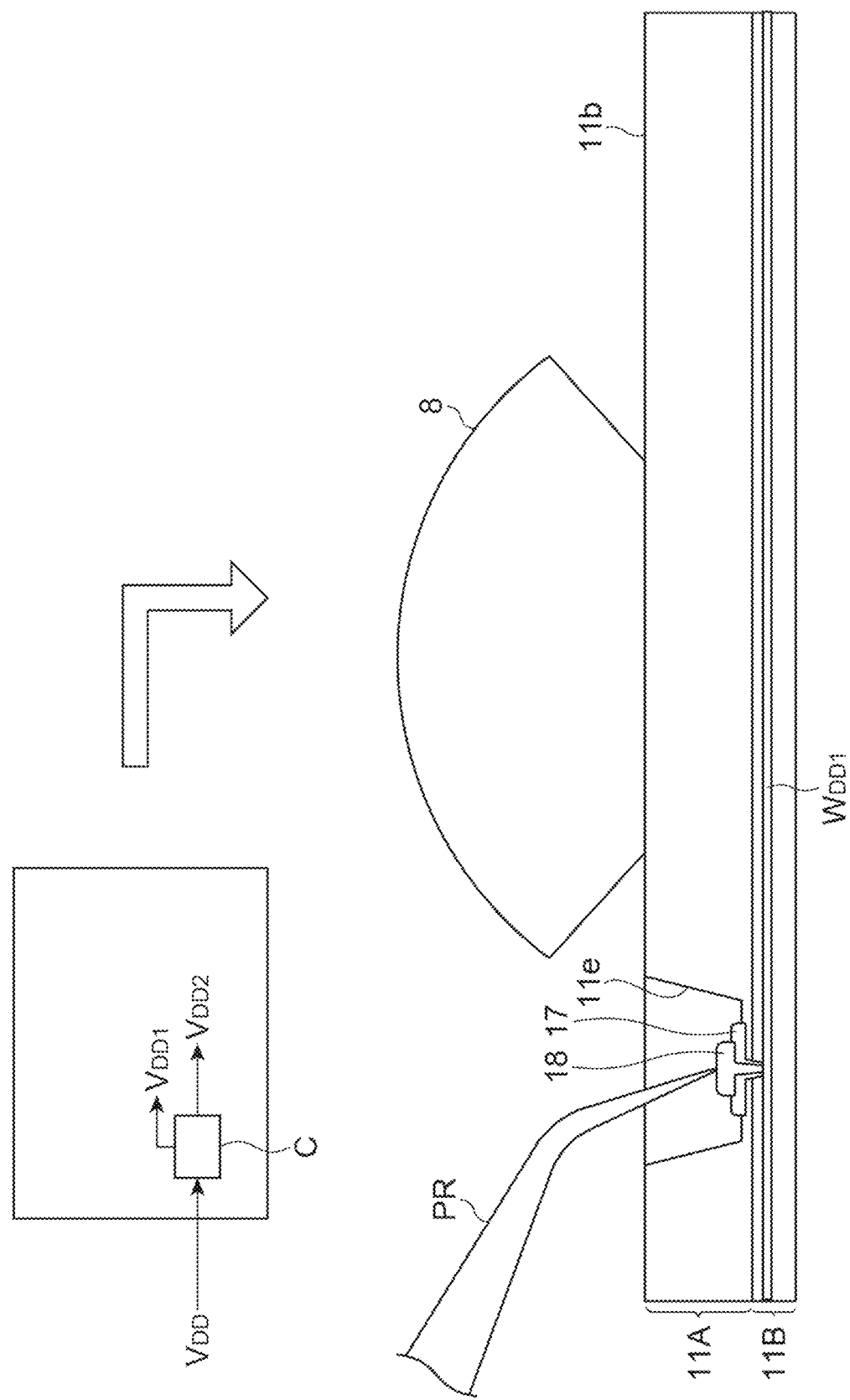

FIG. 15 is a schematic view illustrating a fifth constitutional example for acquiring an OBIC signal.

DESCRIPTION OF EMBODIMENT

Hereinafter, an embodiment of the present disclosure will be described in detail with reference to the drawings. In description of the drawings, the same reference signs are applied to the same elements, and duplicate description thereof will be omitted.

Figure 1:
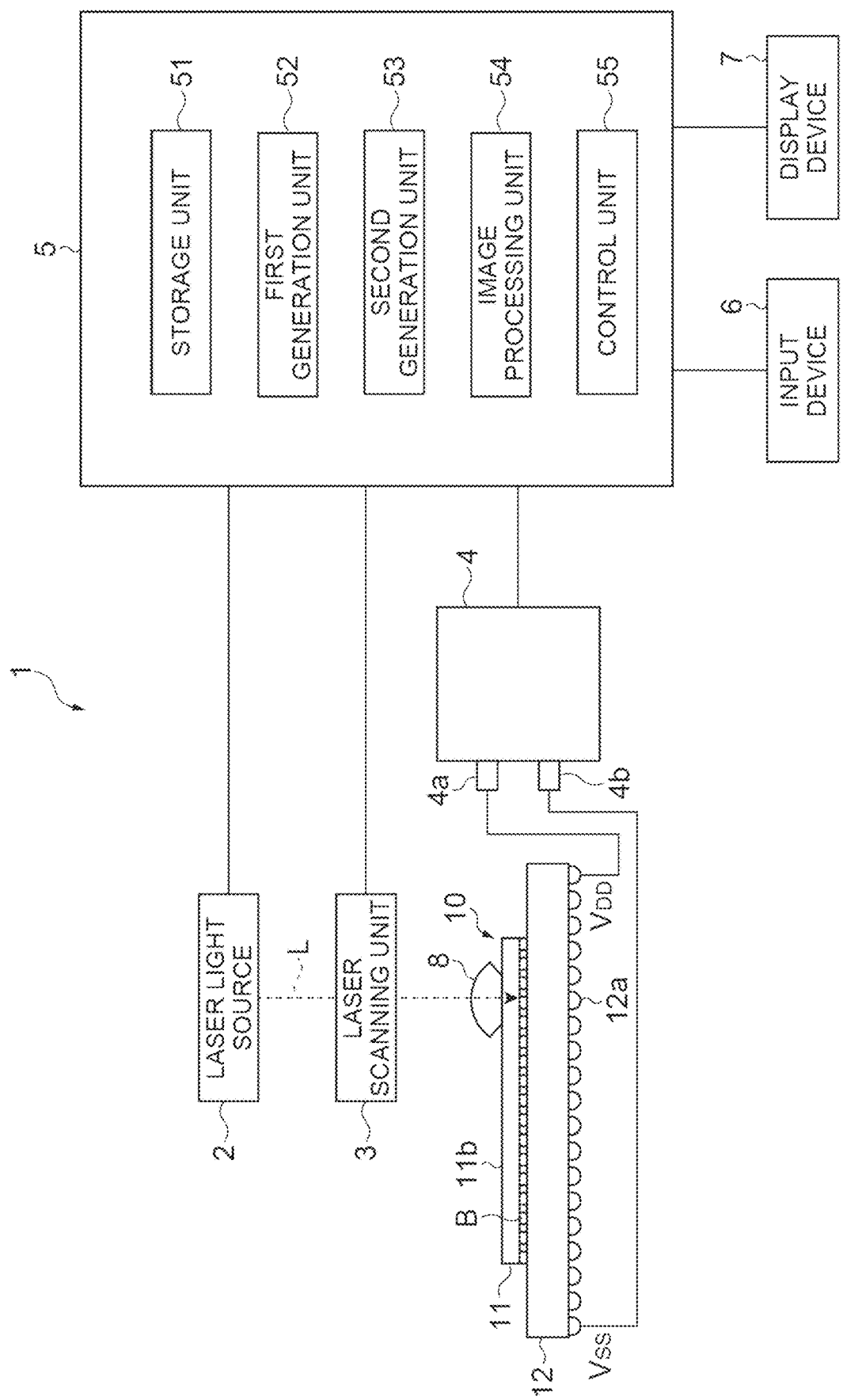
FIG. 1 is a view of a schematic constitution of a semiconductor inspecting device according to an embodiment.
Figure 2:
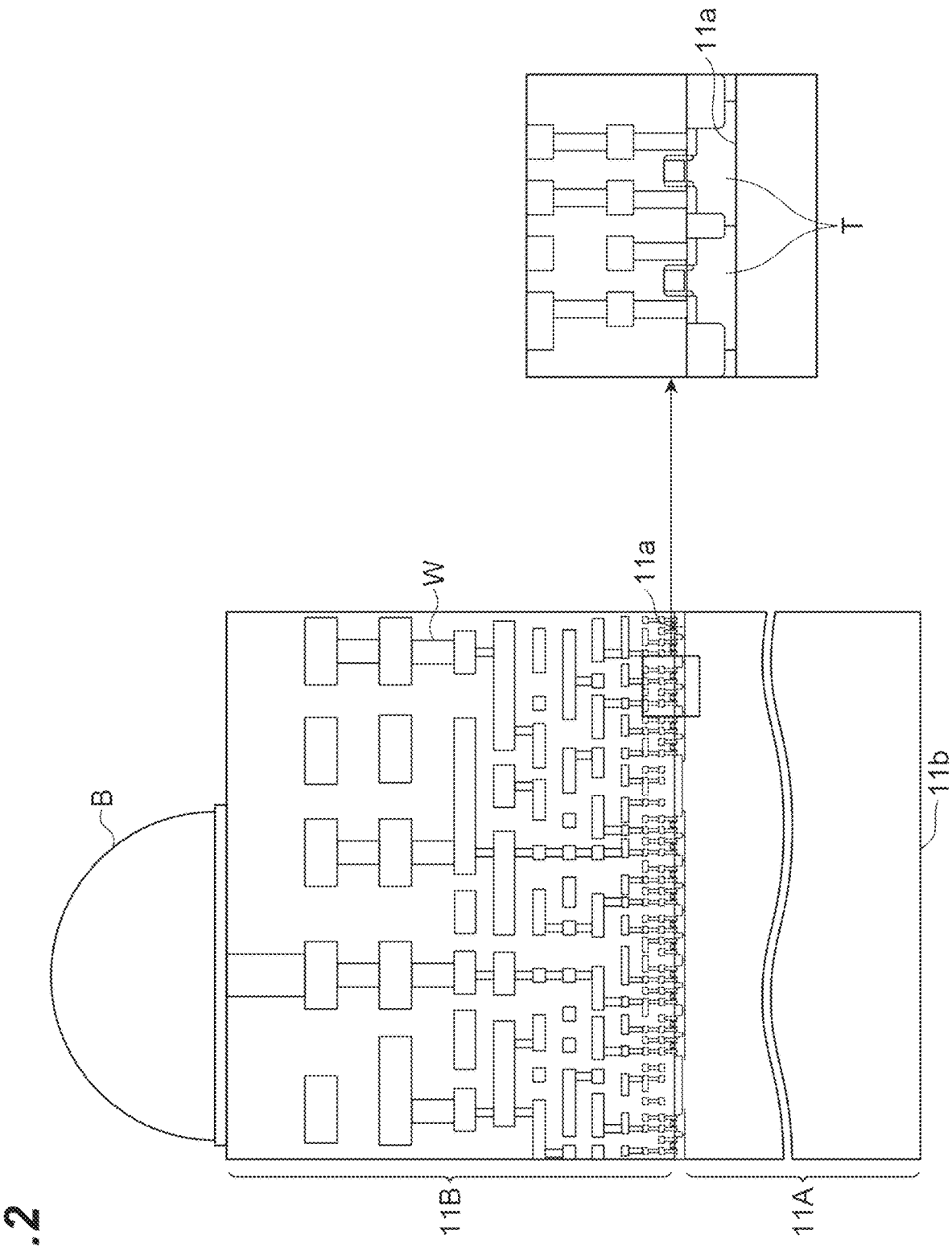
FIG. 2 is a schematic view illustrating a constitutional example of a semiconductor device.

FIG. 1 is a view of a schematic constitution of a semiconductor inspecting device 1 according to an embodiment. FIG. 2 is a schematic view illustrating a constitutional example of a semiconductor device 10 that is a device under test. For example, the semiconductor device 10 is a logic LSI, a memory, an integrated circuit (IC) such as an analog circuit, a power device, or the like. As an example, the semiconductor device 10 has a semiconductor chip 11 and a package substrate 12. The semiconductor chip 11 has a semiconductor substrate 11A, a wiring layer 11B, and a bump B.

For example, the semiconductor substrate 11A has a main surface 11a with transistors T such as MOS transistors formed thereon, and a rear surface 11b on a side opposite to the main surface 11a. For example, the semiconductor substrate 11A is a silicon substrate. However, a material of the semiconductor substrate 11A is not limited to silicon. For example, when the semiconductor device 10 is a high-frequency device, a photonic device, or the like, a compound semiconductor such as GaAs or GaP may be used as the material of the semiconductor substrate 11A. In addition, when the semiconductor device 10 is a power device, SiC, GaN, or the like may be used as the material of the semiconductor substrate 11A.

The wiring layer 11B is a layer for disposing metal wirings W which are electrically connected to the transistors T on a main surface 11a side of the semiconductor substrate 11A. The bump B is provided on a surface on a side opposite to a semiconductor substrate 11A side of the wiring layer 11B. The package substrate 12 is a wiring substrate having the semiconductor chip 11 mounted thereon. The package substrate 12 is electrically connected to the metal wirings W provided in the wiring layer 11B of the semiconductor chip 11 through the bump B. The package substrate 12 is provided with terminals 12a corresponding to power sources ($V_{DD}$) or grounds ($V_{SS}$) of the transistors T.

FIG. 3 is a schematic view illustrating an example of a layout of a part of the semiconductor device 10 (a part near the main surface 11a of the semiconductor substrate 11A). (A) of FIG. 3 is a schematic plan view in a direction facing the main surface 11a of the semiconductor substrate 11A. (B) of FIG. 3 is a schematic cross-sectional view along line B-B in (A) of FIG. 3. (C) of FIG. 3 is a schematic cross-sectional view along line C-C in (A) of FIG. 3. As illustrated in (A), (B), and (C) of FIG. 3, first conductive-type diffusion layers 11c1 and 11c2 (11c) and an insulation layer 11d for isolating the diffusion layer 11c are formed on the main surface 11a of the semiconductor substrate 11A. The diffusion layer 11c is a region in which impurities are diffused. Here, as an example, the diffusion layer 11c1 is a region in which n-type impurities are diffused, and the diffusion layer 11c2 is a region in which p-type impurities are diffused. The pattern illustrated in FIG. 3 is an extracted part of one cell column in the semiconductor device 10. The insulation layer 11d includes an element isolation layer 11d1 isolating elements which are disposed in a cell column direction corresponding to a lateral direction in FIG. 3. For example, the insulation layer 11d is formed of SiO2 or the like. As illustrated in (C) of FIG. 3, the diffusion layer 11c has a shape of a plurality of ridges which are generally referred to as fins. Impurities different from those in the diffusion layer 11c are injected into upper portions of the fins by ion implantation or the like. Here, as an example, the p-type impurities having a predetermined concentration are injected into an upper portion of the diffusion layer 11c1, and the n-type impurities having a predetermined concentration are injected into an upper portion of the diffusion layer 11c2. In this manner, second conductive-type fin portions 14a and 14b (14) are formed. In the present embodiment, as an example, the semiconductor device 10 is a device manufactured by a 7 nm process (7 nm device), and intervals between adjacent gates 13 are approximately several tens of nm, for example. The parts including the fin portions 14 and the gates 13 function as the transistors T in the semiconductor device 10 when a voltage is applied to the gates 13 which are formed to straddle the fin portions 14 therebetween in this manner. The transistors T having such a structure are referred to as fin field-effect transistors (FinFETs). The diffusion layer 11c1 (a region in which the n-type impurities are diffused) and the fin portions 14a (regions into which the p-type impurities are injected) formed thereon operate as p-type transistors (PMOSs). On the other hand, the diffusion layer 11c2 (a region in which the p-type impurities are diffused) and the fin portions 14b (regions into which the n-type impurities are injected) formed thereon operate as n-type transistors (NMOSs). In addition to the gates 13 straddling the fin portions 14, gates 13a are also formed on the element isolation layer 11d1. However, the gates 13a do not have a function of original gates and are referred to as dummy gates. The fin portions 14 are electrically connected to the metal wirings W (first metal layer) via vias V (also referred to as contacts). Accordingly, each of the fin portions 14 is electrically connected to the power source ($V_{DD}$), the ground ($V_{SS}$), or the gate 13 constituting another transistor T via the via V (contact) and the metal wiring W.

The semiconductor inspecting device 1 includes a laser light source 2 (light source), a laser scanning unit 3 (scanning unit), an amplifier 4 (measurement unit), a computer 5, an input device 6, and a display device 7. The laser light source 2 and the laser scanning unit 3 constitute an optical system for irradiating and scanning the semiconductor device 10 with a laser light L that is stimulation light. The laser light source 2 is a light source emitting the laser light L. The laser scanning unit 3 performs two-dimensional scanning with respect to the semiconductor device 10 with the laser light L emitted from the laser light source 2. For example, the laser scanning unit 3 is constituted of a galvanometer mirror, a MEMS mirror, or the like. The laser scanning unit 3 is constituted to perform scanning with respect to the rear surface 11b of the semiconductor substrate 11A with the laser light L transmitted from the rear surface 11b to the main surface 11a. A focus of the laser light L is adjusted to a part near the main surface 11a of the semiconductor substrate 11A (that is, regions in which the transistors T are formed). As illustrated in FIG. 1, a solid immersion lens (SIL) 8 may be disposed on the rear surface 11b of the semiconductor substrate 11A. That is, the rear surface 11b of the semiconductor substrate 11A may be irradiated with the laser light L via the solid immersion lens 8. When the solid immersion lens 8 is disposed, the numerical aperture (NA) for the laser light L for irradiating the rear surface 11b of the semiconductor substrate 11A can be further increased compared to when the solid immersion lens 8 is not disposed.

For example, the laser light source 2 may be constituted to emit the laser light L having an energy greater than a bandgap (1.12 eV in a case of silicon) of the material of the semiconductor substrate 11A (silicon in the present embodiment). That is, the laser light L may be light having a wavelength shorter than the wavelength corresponding to the bandgap (energy gap) of silicon (1,107 nm). In this case, an optical beam induced current (OBIC) can be favorably generated by causing single photon absorption (SPA) in the transistors T on the main surface 11a side of the semiconductor substrate 11A (for example, p-n junction portions).

Alternatively, for example, the laser light source 2 may be constituted to emit the laser light L that is pulse light having an energy smaller than the bandgap of the material of the semiconductor substrate 11A. That is, the laser light L may be pulse light having a wavelength longer than the wavelength corresponding to the bandgap of silicon (1,107 nm). In this case, an OBIC can be favorably generated, for example, by causing multi photon absorption (MPA) as described in Japanese Unexamined Patent Publication No. H10-332794 in the transistors T on the main surface 11a side of the semiconductor substrate 11A (for example, p-n junction portions).

The amplifier 4 measures characteristics of an electrical signal of the semiconductor device 10 in response to irradiation with the laser light L for each of irradiation positions of the laser light L. In the present embodiment, the amplifier 4 acquires a measurement value of an OBIC (OBIC signal) generated by the semiconductor device 10 in response to irradiation with the laser light L as the characteristics of the electrical signal. The amplifier 4 has a pair of terminals 4a and 4b. The one terminal 4a of the amplifier 4 is electrically connected to the terminal 12a of the package substrate 12 corresponding to the power source ($V_{DD}$) of the transistor T on a drain side. The other terminal 4b of the amplifier 4 is electrically connected to the terminal 12a of the package substrate 12 corresponding to the ground ($V_{SS}$) of the transistor T on a source side. The amplifier 4 inputs the measurement value (OBIC signal) obtained by detecting and amplifying the OBIC generated by the laser light L to the computer 5.

The computer 5 is a device performing various kinds of image processing (which will be described below), processing of an OBIC signal input from the amplifier 4, control of units constituting the semiconductor inspecting device 1, and the like. For example, the computer 5 includes a processor (for example, CPU), an internal memory (for example, ROM or RAM), a storage medium (for example, HDD or SSD), and the like. The computer 5 has a storage unit 51, a first generation unit 52, a second generation unit 53, an image processing unit 54 (processing unit), and a control unit 55 as functional constituent elements. In addition, the input device 6 such as mouse and a keyboard for inputting data to the computer 5, the display device 7 such as a display for displaying (outputting) a processing result (an image or the like) of the computer 5, and the like are connected to the computer 5. For example, each function of the computer 5 is realized when the foregoing processor executes a computer program stored in the foregoing internal memory or the foregoing storage medium.

The storage unit 51 stores a layout image of the semiconductor device 10 that is an inspecting target. FIG. 4 is a view illustrating an example of a layout image (layout image P1). For example, the layout image P1 is a design image showing a pattern of the semiconductor device 10, such as CAD data acquired from the outside. In addition, the storage unit 51 stores current path information indicative of a current path corresponding to the layout image P1. For example, the current path information is information indicative of a target (connection target) in which each of regions shown in the layout image P1 is connected via the metal wiring W of the wiring layer 11B. Examples of classification of such current paths (connection targets) include four items such as power source ($V_{DD}$), ground ($V_{SS}$), gate, and no connection destination, for example. In addition, the storage unit 51 suitably stores OBIC signals sent from the amplifier 4, processing results (data of images and the like) of the first generation unit 52, the second generation unit 53, and the image processing unit 54 which will be described below, and the like.

The first generation unit 52 generates a first pattern image of the semiconductor device 10 based on characteristic information indicative of characteristics of an electrical signal obtained for each of irradiation positions. In the present embodiment, the characteristic information is an OBIC signal measured by the amplifier 4. In addition, the first pattern image is an OBIC image obtained based on the OBIC signal. The OBIC image is an image obtained by matching the value of the OBIC signal to an irradiation position of the laser light L and imaging it (that is, converting the value of the OBIC signal into a pixel value). The OBIC image of the present embodiment is an image in which the pixel values are set such that a region having a larger current quantity of an OBIC becomes brighter. FIG. 5 is an image diagram (OBIC image P2) of the OBIC image of the semiconductor device 10 (7 nm device). Specifically, the OBIC image P2 illustrated in FIG. 5 is an image made by the inventor through inference from an OBIC image of a semiconductor device manufactured by a 40 nm process.

FIG. 6 is a graph showing a relationship between a wavelength of the laser light L and a resolution of an obtained OBIC image, and a relationship between the wavelength of the laser light L and a transmittance of a silicon substrate. In FIG. 6, the dashed line indicates a wavelength corresponding to the bandgap of silicon (1,107 nm). A graph G1 expresses the resolution of an obtained OBIC image when single photon absorption (SPA) is caused. A graph G2 expresses the resolution of an obtained OBIC image when multi photon absorption (MPA) is caused. As illustrated in FIG. 6, it is known that the resolution (G2) when MPA is caused becomes $1/\sqrt{2}$ of the resolution (G1) when SPA is caused. In addition, a graph G3 shows a relationship between a wavelength of the laser light L and a transmittance of a silicon substrate (here, as an example, a silicon substrate having a thickness of 100 μm). As shown in the graph G3, in MPA in which the laser light L having a longer wavelength than a wavelength corresponding to the bandgap of silicon is used, since approximately 100% of the laser light L can be transmitted through the silicon substrate, efficient irradiation with the laser light L can be realized. Specifically, in SPA in which the laser light L having a wavelength of 1,000 nm is used, the resolution is approximately 160 nm, and the transmittance of the laser light L with respect to the silicon substrate is approximately 50%. In contrast, in MPA in which the laser light L (pulse light) having a wavelength of 1,300 nm is used, a resolution (approximately 150 nm) equivalent to or better than that in SPA in which the laser light L having a wavelength of 1,000 nm is used can be obtained, and the transmittance of the laser light L with respect to the silicon substrate becomes approximately 100%. Therefore, from a viewpoint of achieving both improvement in resolution and improvement in irradiation efficiency of the laser light L, it is preferable to use the laser light L causing MPA rather than SPA (that is, pulse light having an energy smaller than the bandgap of silicon). On the other hand, there is a need for a pulse laser applied in MPA to have a high peak-to-peak value. Examples of such a pulse laser include a ultrashort pulse laser which is referred to as a femtosecond laser. When such a special laser is used, limitations such as stability and a selection range for a wavelength are imposed. In addition, laser itself is expensive. Thus, from a viewpoint of achieving reduction in device price (manufacturing costs) of the semiconductor device 10, it is preferable to use SPA rather than MPA. However, it may be necessary to prioritize the resolution in order to perform sufficient analysis. Therefore, selection of the method between SPA and MPA to be mounted in the device may be determined in accordance with the extent of details of necessary analysis performed with respect to the semiconductor device 10 by a user.

Here, electron-hole pairs are generated in p-n junction portions due to irradiation with the laser light L. Further, parts of the p-n junction portions in which an OBIC is most likely to flow are parts connected to the power sources ($V_{DD}$) or the grounds ($V_{SS}$). In parts of the p-n junction portion connected to the gates as well, a slight quantity of OBIC flows due to leakage from the gates. On the other hand, in parts of the p-n junction portions which are not connected to any part, an OBIC scarcely flows. In addition, in parts of the element isolation layer 11$d$1 in which dummy gates 13$a$ are provided (parts excluding parts overlapping dummy gates 13$a$), even if an OBIC flows, the quantity thereof is extremely small. In this manner, in the semiconductor device 10, the current quantity of an OBIC differs for each classification of the current path described above. Further, due to the difference in such current quantity, a shade difference occurs in each region in the OBIC image P2.

Hence, the second generation unit 53 generates an image (second pattern image) similar to the OBIC image P2 from the layout image P1 based on the properties of the OBIC image described above. That is, the second generation unit 53 generates the second pattern image of the semiconductor device 10 based on the layout image P1 of the semiconductor device 10 and the current path information of the semiconductor device 10 (in the present embodiment, classification of the current path (connection target) in each region described above). For example, the second generation unit 53 performs first processing and second processing, which will be described below.

(First Processing)

The first processing includes classification processing and color setting processing. The classification processing is processing of classifying at least a part of the diffusion layer 11$c$ included in the semiconductor device 10 and at least a part of the element isolation layer 11$d$1 based on the current path information. The color setting processing is processing of setting a color corresponding to the classification of the current path with respect to at least a part of the diffusion layer 11$c$ and at least a part of the element isolation layer 11$d$1 in the layout image P1. FIG. 7 is a view illustrating a box setting image P3 generated through the first processing with respect to the layout image P1.

(Classification Processing)

As an example, the second generation unit 53 sets rectangular box regions BA (BA1, BA2, and BA3) between gates 13 adjacent to each other in the diffusion layer 11$c$ (regions in which the diffusion layer 11$c$ is provided when viewed in a thickness direction of the semiconductor substrate 11A) in the classification processing. Similarly, the second generation unit 53 sets a rectangular box region BA (BA4) between gates 13A adjacent to each other in the element isolation layer 11$d$1. The box regions BA1 to BA4 are classified depending on the current path described above. Specifically, the box region BA1 is a region connected to the power source ($V_{DD}$) or the ground ($V_{SS}$). The box region BA2 is a region connected to the gate. The box region BA3 is a region having no connection destination (an isolated region in the diffusion layer 11$c$). The box region BA4 is an isolated region in the element isolation layer 11$d$1.

(Color Setting Processing)

Subsequently, the second generation unit 53 sets a color corresponding to the classification of the current path with respect to each of the box regions BA1 to BA4 in the color setting processing. As described above, the magnitude relationship between the current quantities of an OBIC corresponding to the respective box regions BA1 to BA4 is "BA1>BA2>BA3>BA4". For this reason, in the OBIC image P2, the region corresponding to the box region BA2 is darker than the region corresponding to the box region BA1. In addition, the region corresponding to the box region BA3 is darker than the region corresponding to the box region BA2. In addition, the region corresponding to the box region BA4 is darker than the region corresponding to the box region BA3. Hence, the second generation unit 53 sets the brightest color (for example, color close to white) for the box region BA1, a color darker (for example, light grey) than that of the box region BA1 is set for the box region BA2, a color darker (for example, dark grey) than that of the box region BA2 is set for the box region BA3, and a color darker (for example, color close to black) than that of the box region BA3 is set for the box region BA4. Further, the second generation unit 53 removes the patterns other than the box regions BA1 to BA4 from the box setting image P3. Accordingly, as illustrated in FIG. 8, a colored image P4 including only a plurality of colored box regions BA can be obtained.

(Second Processing)

The second processing is processing of generating the second pattern image based on the colored image P4. As an example, the second generation unit 53 generates the second pattern image by performing blurring processing with respect to the colored image P4. Regarding the blurring processing, a known blurring processing technique can be used. For example, a parameter (degree of blurring) of the blurring processing may be determined based on the OBIC image P2. For example, an operator (user) may determine the degree of blurring the colored image P4 while checking the OBIC image P2 displayed in the display device 7 such that the second pattern image similar to the OBIC image P2 as much as possible is generated. Further, the second generation unit 53 may generate the second pattern image (blurred image) by executing the blurring processing with respect to the colored image P4 based on the degree of blurring input by the operator via the input device 6. Alternatively, the second generation unit 53 may execute the blurring processing with respect to the colored image P4 based on the degree of blurring set in advance without human intervention. FIG. 9 is a view illustrating an example of a blurred image P5 obtained through the blurring processing.

In addition, processing of generating the blurred image P5 from the colored image P4 may be performed using conversion processing learned through machine learning in place of the foregoing blurring processing. For example, the second generation unit 53 may learn the conversion processing of the colored image through machine learning using training data including a colored image for learning and an OBIC image corresponding to the colored image for learning in advance. Further, the second generation unit 53 may generate the blurred image P5 by converting the colored image P4 using the conversion processing determined through the foregoing machine learning.

For example, the second generation unit 53 may make a learned model (hereinafter, "a conversion model") having a parameter corresponding to the foregoing conversion processing (learned parameter) in advance and may store it in the storage unit 51. For example, the conversion model is a model learned through the machine learning using the training data described above and constituted to output an image similar to the OBIC image (an image corresponding to an image generated through the blurring processing described above) by inputting a colored image. Regarding the training data (a colored image for learning and an OBIC image corresponding to the colored image for learning), for example, it is possible to use a colored image and an OBIC image obtained from the semiconductor device which has been taken as an inspecting target in the past. Further, the second generation unit 53 may acquire an image output from the conversion model as the blurred image P5 by inputting the colored image P4 to the conversion model. For example, the conversion model is a neural network, a multilayered neural network established through deep learning, or the like. Examples of the conversion model include a convolutional neural network (CNN), a fully convolutional network (FCN), a U-Net, and a residual network (ResNet). However, the conversion model is not limited to any particular model. In addition, the number of nodes and the number of layers of the conversion model may also be arbitrarily set.

The image processing unit 54 acquires matching information indicative of a relative relationship (corresponding relationship) between the OBIC image P2 and the layout image P1 (refer to FIG. 4) based on a result of positional alignment between the OBIC image P2 (refer to FIG. 5) and the blurred image P5 (refer to FIG. 9). For example, positional alignment between the OBIC image P2 and the blurred image P5 is performed by identifying three or more points corresponding to each other between the OBIC image P2 and the blurred image P5. Such positional alignment may be performed by a known pattern matching technique or may be executed by an operator. For example, the image processing unit 54 may present the OBIC image P2 and the blurred image P5 to a user (operator) via the display device 7 and may acquire information indicative of the corresponding relationship between the OBIC image P2 and the blurred image P5 designated by the operator via the input device 6 (for example, information indicative of three or more points corresponding to each other). As described above, since the blurred image P5 is an image generated based on the colored image P4 so as to resemble the OBIC image P2 as much as possible, the operator can perform positional alignment between the blurred image P5 and the OBIC image P2 with a certain degree of accuracy even by visual recognition. In addition, since the blurred image P5 is an image generated from the layout image P1, the corresponding relationship between the coordinates set in the blurred image P5 and the coordinates set in the layout image P1 is ascertained in advance. Therefore, the image processing unit 54 can obtain matching information between the OBIC image P2 and the layout image P1 from a result of the positional alignment between the OBIC image P2 and the blurred image P5. For example, the obtained matching information is stored in the storage unit 51.

The matching information is information for identifying the corresponding coordinate position in the layout image P1 of an arbitrary coordinate position in the OBIC image P2 (alternatively, information for identifying a corresponding coordinate position in the OBIC image P2 of an arbitrary coordinate position in the layout image P1). For example, the matching information may be information for mutually converting the coordinates of the OBIC image P2 and the coordinates associated with the layout image P1 (for example, a function or the like). Here, the coordinates in the OBIC image P2 are coordinates associated with the irradiation position of the laser light L and are coordinates for controlling operation of the semiconductor inspecting device 1 (that is, coordinates in a coordinate system recognized by the semiconductor inspecting device 1). However, the information included in the matching information is not limited to that described above. For example, the matching information may include angle information indicative of a rotation angle the layout image P1 with respect to the OBIC image P2, and information such as the magnification of the layout image P1 with respect to the OBIC image P2. Those described are generalized as follows. A first two-dimensional coordinate system regulating the layout image P1 and a second two-dimensional coordinate system regulating the OBIC image P2 are present. Here, the length-width scale and the horizontal-vertical angle may differ between the first coordinate system and the second coordinate system. However, it is considered that the coordinate planes of both the coordinate systems are flat and have no distortion. At this time, three points (X1, Y1), (X2, Y2), and (X3, Y3) in the first coordinate system and three corresponding points (x1, y1), (x2, y2), and (x3, y3) in the second coordinate system at the same positions as the foregoing three points are designated. When there is no distortion in the first coordinate system and the second coordinate system, the points in the first coordinate system and the points in the second coordinate system match each other by primary conversion. A conversion expression for converting an arbitrary point in the one coordinate system into a corresponding point in the other coordinate system based on such a corresponding relationship is obtained. The function described above corresponds to this conversion expression. In addition, angle information and a magnification may be included in this conversion expression. In such a case in which particular conditions (for example, a situation in which both coordinate systems are on the same plane) are established between both coordinate systems, the conversion expression may be simplified. For example, interconversion between the first coordinate system and the second coordinate system can be performed by only coordinate rotation or coordinate shift.

The image processing unit 54 may generate a superimposed image P6 (refer to FIG. 11) in which the layout image P1 and the OBIC image P2 are superimposed based on the matching information obtained as described above. In FIG. 11, for the sake of convenience, the superimposed image P6 is expressed in plain color. Actually, in the superimposed image P6, on one image of the layout image P1 and the OBIC image P2, the other image set with a transmittance is superimposed. It is possible to obtain the superimposed image P6 in which the layout image P1 and the OBIC image P2 are accurately superimposed by using the matching information described above. As a result, it is possible to accurately perform failure analysis and the like using the superimposed image P6. As the superimposed image P6, the image processing unit 54 may generate an image in which an image other than the layout image P1 and the OBIC image P2 (for example, the box setting image P3, the colored image P4, the blurred image P5, or the like) is superimposed as necessary. For example, the image processing unit 54 may allow an operator to select an target image to be superimposed, the order of superimposition, the transmittance of each image, and the like so as to generate a superimposed image on the basis of the selected details.

Alternatively, the image processing unit 54 may display the layout image P1 and the OBIC image P2 on a display of the display device 7 side by side. In this case, when a cursor is located at an arbitrary position on one image of the layout image P1 and the OBIC image P2 by operation of an operator via the input device 6 such as a mouse, the image processing unit 54 may display another cursor at a position on the other image corresponding to the cursor position on the one image on the basis of the matching information. Even by such parallel display, an operator can easily ascertain the corresponding relationship between the layout image P1 and the OBIC image P2.

In addition, the image processing unit 54 may identify a failure position identified through failure analysis with respect to the semiconductor device 10 and a position on the layout image P1 based on the matching information or set a position of probing with respect to the semiconductor device 10 based on the matching information. For example, the image processing unit 54 captures an image of heat generation or luminescence occurring due to a failure of the semiconductor device 10 by means of an image-capturing unit (not illustrated) by applying a test pattern of a predetermined electrical signal, a predetermined voltage, or a predetermined current to the semiconductor device 10 using a tester (not illustrated) included in the semiconductor inspecting device 1. The coordinates of the failure position (reaction position) indicated in a heat-generation image or a luminescent image captured by the image-capturing unit in this manner are ascertained as the coordinates the OBIC image P2 (that is, the coordinates for controlling operation of the semiconductor inspecting device 1). Therefore, the image processing unit 54 can identify the failure position on the layout image P1 by using the matching information. The technique of failure analysis is not limited to a specific technique. For example, regarding the technique of failure analysis, optical beam-induced resistance current (OBIRCH) analysis, soft defect localization (SDL) analysis, laser-assisted device alteration (LADA) analysis, electro-optical frequency mapping (EOFM) analysis, and the like may be used in addition to the heat-generation analysis and the luminescence analysis described above.

In addition, through the matching information, arbitrary coordinates on the layout image P1 can be converted into the coordinates of the OBIC image P2 corresponding to the foregoing coordinates (that is, the coordinates for controlling operation of the semiconductor inspecting device 1). That is, using the matching information, the position of probing by the semiconductor inspecting device 1 can be designated by designating arbitrary coordinates on the layout image P1. For example, the image processing unit 54 acquires the position (coordinates) on the layout image P1 designated by an operator via the input device 6 by presenting the layout image P1 to the operator via the display device 7. Further, the image processing unit 54 can set the position of probing (for example, the position of probing at the time of electro-optical probing (EOP) analysis) by the semiconductor inspecting device 1 by converting the coordinates acquired in this manner into the coordinates for controlling operation of the semiconductor inspecting device 1 on the basis of the matching information. As described above, using the matching information, it is possible to accurately perform failure analysis (identification of the failure position or setting of the probing position on the layout image P1).

The control unit 55 controls data processing in the computer 5, and operation of the devices (the laser light source 2, the laser scanning unit 3, the amplifier 4, the input device 6, the display device 7, and the like) connected to the computer 5.

Next, with reference to FIGS. 10 and 11, an example of a processing procedure of a semiconductor inspecting method executed by the semiconductor inspecting device 1 will be described.

In Step S1, the semiconductor inspecting device 1 (mainly, the laser light source 2, the laser scanning unit 3, and the amplifier 4) scans the semiconductor device 10 with the laser light L, thereby acquiring characteristic information indicative of characteristics of an electrical signal of the semiconductor device 10 (in the present embodiment, an OBIC signal) in response to irradiation with the laser light L for each of the irradiation positions of the laser light L. Further, the semiconductor inspecting device 1 (mainly, the first generation unit 52) generates the first pattern image (in the present embodiment, the OBIC image P2) of the semiconductor device 10 based on the characteristic information for each of the irradiation positions (refer to FIG. 5).

In Step S2, the semiconductor inspecting device 1 (mainly, the second generation unit 53) generates the second pattern image (in the present embodiment, the blurred image P5) based on the layout image P1 and the current path information. As an example, as described above, the second generation unit 53 generates the box setting image P3 (refer to FIG. 7) based on the layout image P1 and the current path information, generates the colored image P4 (refer to FIG. 8) from the box setting image P3, and generates the blurred image P5 (refer to FIG. 9) from the colored image P4. Step S2 may be executed before Step S1, and Step S1 and Step S2 may be executed in parallel.

In Step S3, the semiconductor inspecting device 1 (mainly, the image processing unit 54) acquires the matching information based on a result of positional alignment between the first pattern image (OBIC image P2) and the second pattern image (blurred image P5).

In Step S4, the semiconductor inspecting device 1 (mainly, the image processing unit 54) generates the superimposed image P6 in which the first pattern image (OBIC image P2) and the layout image P1 are superimposed by using the matching information.

In Step S5, the semiconductor inspecting device 1 (mainly, the image processing unit 54) performs failure analysis using the matching information. For example, as described above, the semiconductor inspecting device 1 may identify a failure position identified through failure analysis with respect to the semiconductor device 10 and a position corresponding to the failure position on the layout image P1 or set a position of probing with respect to the semiconductor device 10. When processing of Step S5 is performed, it is not always necessary to perform processing of generating the superimposed image P6 in Step S4, but it is possible to improve convenience for an operator performing failure analysis by generating the superimposed image P6 and presenting it to the operator.

[Effects]

It is known that light (for example, the laser light L) for irradiation of the semiconductor device 10 has a certain width and a full width at half maximum (FWHM) of reflected light from the semiconductor device 10 is larger than a full width at half maximum of incident light on the semiconductor device 10. Here, a resolution of an optical image acquired on the basis of reflected light depends on the full width at half maximum of the observed reflected light. In contrast, a resolution of the first pattern image (OBIC image P2) which is not based on reflected light depends on the full width at half maximum of incident light on the semiconductor device 10. In addition, as the full width at half maximum of light decreases, the resolution of an obtained image decreases. Therefore, it is possible to obtain an image having a higher resolution than an optical image acquired on the basis of reflected light by generating the first pattern image (OBIC image P2) on the basis of the characteristics of an electrical signal (OBIC signal) of the semiconductor device 10 in response to irradiation with the light. Moreover, it is possible to obtain highly accurate matching information between the first pattern image (OBIC image P2) and the layout image P1 on the basis of a result of positional alignment between the second pattern image (blurred image P5) and the first pattern image (OBIC image P2) obtained on the basis of the layout image P1 and the current path in the semiconductor device 10. As above, according to the semiconductor inspecting device 1 and the semiconductor inspecting method described above, it is possible to accurately perform positional alignment between the first pattern image (OBIC image P2) obtained from the semiconductor device 10 and the layout image P1 of the semiconductor device 10. As a result, the failure position of the semiconductor device 10 identified through failure analysis can be displayed on the layout image P1, and the probing position can be easily set by designating the position on the layout image P1.

In addition, the second generation unit 53 may execute the first processing of classifying at least one (in the present embodiment, both) of at least a part of the diffusion layer 11c and at least a part of the element isolation layer 11d1 included in the semiconductor device 10 based on the current path information and setting a color corresponding to the classification with respect to at least a part of the diffusion layer 11c and at least a part of the element isolation layer 11d1 in the layout image P1, and the second processing of generating the second pattern image (blurred image P5) based on the colored image P4 generated through the first processing. According to the foregoing constitution, it is possible to obtain the second pattern image (blurred image P5) capable of accurately performing positional alignment with the layout image P1 based on the colored image P4 colored on the basis of the current path information.

In addition, the foregoing second processing may include the blurring processing with respect to the colored image P4. According to the foregoing constitution, it is possible to obtain the second pattern image (blurred image P5) similar to the first pattern image (OBIC image P2) through the blurring processing. As a result, it is possible to obtain the second pattern image (blurred image P5) capable of accurately performing positional alignment with the first pattern image (OBIC image P2).

In addition, the foregoing second processing may execute processing of learning the conversion processing of the colored image P4 through machine learning using training data including the colored image P4 for learning and the first pattern image (OBIC image P2) corresponding to the colored image P4 for learning, and processing of generating the second pattern image (blurred image P5) by converting the colored image P4 using the conversion processing determined through the learning. According to the foregoing constitution, it is possible to obtain the second pattern image (blurred image P5) similar to the first pattern image (OBIC image P2) through the conversion processing based on a result of the machine learning. As a result, it is possible to accurately perform positional alignment between the first pattern image (OBIC image P2) and the second pattern image (blurred image P5).

In addition, the image processing unit 54 may execute processing of presenting the first pattern image (OBIC image P2) and the second pattern image (blurred image P5) to a user, and processing of acquiring the matching information based on information indicative of a corresponding relationship between the first pattern image (OBIC image P2) and the second pattern image (blurred image P5) designated by a user. According to the foregoing constitution, it is possible for a user to perform visually observed positional alignment between the first pattern image (OBIC image P2) and the second pattern image (blurred image P5).

In addition, the amplifier 4 may acquire a measurement value (OBIC signal) of an optical beam induced current (OBIC) generated in response to irradiation of the semiconductor device 10 with the laser light L as the characteristic information. According to the foregoing constitution, it is possible to obtain an OBIC image, in which a hue (shade) corresponding to the measurement value of the optical beam induced current is set, as the first pattern image.

MODIFICATION EXAMPLES

Hereinabove, the embodiment of the present disclosure has been described, but the present disclosure is not limited to the embodiment described above. A material and a shape of each constituent is not limited to the material and the shape described above, and various materials and shapes can be employed.

For example, in the foregoing embodiment, the blurred image P5 obtained by performing the blurring processing with respect to the colored image P4 (or the conversion processing using a conversion model) is used as the second pattern image, but the colored image P4 may be used as the second pattern image.

In addition, the processing of acquiring the matching information described above may be performed using processing of positional alignment learned through machine learning. For example, the image processing unit 54 may execute processing of learning processing of positional alignment between the first pattern image (OBIC image P2) and the second pattern image (the colored image P4 or the blurred image P5) in advance through machine learning using training data including the first pattern image for learning (OBIC image P2), the second pattern image (the colored image P4 or the blurred image P5) corresponding to the first pattern image for learning (OBIC image P2), and a matching result of the images (a result of the positional alignment). For example, the image processing unit 54 may make a learned model (hereinafter, "a positional alignment model") having a parameter corresponding to the processing of positional alignment (learned parameter) in advance and may store it in the storage unit 51. For example, the positional alignment model is a model learned through machine learning using the training data described above and constituted to output a result of the positional alignment between the first pattern image and the second pattern image (for example, coordinates of three or more points corresponding to each other between both images, or the like) by inputting the first pattern image and the second pattern image. Regarding the training data, for example, it is possible to use an OBIC image, a colored image (or a blurred image), and a set of matching results obtained through processing with respect to the semiconductor device which has been taken as an inspecting target in the past.

Further, the image processing unit 54 may execute processing of acquiring the matching information indicative of a relative relationship between the first pattern image (OBIC image P2) and the layout image P1 by performing positional alignment between the first pattern image (OBIC image P2) and the second pattern image (the colored image P4 or the blurred image P5) using the processing of positional alignment determined through the foregoing learning. For example, the image processing unit 54 may acquire a result output from the positional alignment model by inputting the first pattern image and the second pattern image to the positional alignment model as a result of the positional alignment between the images. Further, the image processing unit 54 may acquire the matching information based on the result of positional alignment obtained in this manner. For example, the positional alignment model is a neural network, a multilayered neural network established through deep learning, or the like. Examples of the positional alignment model include a convolutional neural network (CNN), a fully convolutional network (FCN), a U-Net, and a residual network (ResNet). However, the positional alignment model is not limited to any particular model. In addition, the number of nodes and the number of layers of the positional alignment model may also be arbitrarily set. According to the foregoing constitution, it is possible to accurately perform positional alignment between the first pattern image and the second pattern image through processing of positional alignment based on a result of the machine learning. In addition, when the colored image P4 is used as the second pattern image, there is a possibility that the accuracy of positional alignment may be degraded by a technique such as visual recognition by an operator or pattern matching in the related art. On the other hand, even when the colored image P4 is used as the second pattern image by using the foregoing positional alignment model, it can be expected that positional alignment between the first pattern image and the second pattern image can be accurately performed. That is, when the foregoing positional alignment model is used, processing of generating the colored image P4 to the blurred image P5 can be omitted while the accuracy of positional alignment is secured.

With reference to FIGS. 12 to 15, constitutional examples (first constitutional example to fifth constitutional example) for acquiring an OBIC signal will be described.

First Constitution Example

FIG. 12 is a schematic view illustrating the first constitutional example. In this example, the semiconductor device 10 is divided into a plurality of blocks BR having power source voltages different from each other. A block BR1 is constituted such that a first voltage is applied from a power source $V_{DD1}$, and a block BR2 is constituted such that a second voltage is applied from a power source $V_{DD2}$. In this case, when an OBIC signal is acquired by scanning a region of the block BR1 with the laser light L, one terminal 4a of the amplifier 4 (a terminal on a side opposite to the terminal 4b on a side connected to a ground $V_{SS}$) may be connected to the terminal 12a of the package substrate 12 corresponding to the power source $V_{DD1}$. On the other hand, when an OBIC signal is acquired by scanning a region of the block BR2 with the laser light L, one terminal 4a of the amplifier 4 may be connected to the terminal 12a of the package substrate 12 corresponding to the power source $V_{DD2}$.

Second Constitutional Example

FIG. 13 is a schematic view illustrating the second constitutional example. As illustrated in FIG. 13, the semiconductor device 10 (the semiconductor chip 11 and the package substrate 12) described above may be mounted on a board 16 such as a printed board via a socket 15. In this case, the terminals 4a and 4b of the amplifier 4 may be connected to a power source terminal and a ground terminal provided in the board 16.

Third Constitutional Example (A) of FIG. 14 is a schematic view illustrating the third constitutional example. As illustrated in (A) of FIG. 14, when the power source $V_{DD}$ and the ground $V_{SS}$ are directly connected inside the semiconductor chip 11, for example, as illustrated in FIG. 13, the terminals 4a and 4b of the amplifier 4 may be connected to the power source $V_{DD}$ and the ground $V_{SS}$, and change (that is, an OBIC signal) in a current $I_{DD}$ flowing in response to irradiation with the laser light L may be monitored without applying any bias current. Since no bias current is applied, noise components can be reduced as much as possible, and thus measurement (identification) of an OBIC signal can be easily performed.

Fourth Constitutional Example (B) of FIG. 14 is a schematic view illustrating the fourth constitutional example. As illustrated in (B) of FIG. 14, when a MOS switch SW is provided in the ground $V_{SS}$, the ground $V_{SS}$ is connected to the outside by setting the semiconductor device 10 to be in a standby state. In this state, it is possible to detect a current change in which an OBIC signal flows along a leakage current at a certain level. The diagram on the left side in (B) of FIG. 14 simply illustrates an actual constitution. Actually, the MOS (transistors T) switches between ON and OFF by a circuit controlling the switch. In addition, the amplifier 4 may be constituted of a differentiating circuit in order to detect a minute current. In this case, the quantity of change in current can be detected. That is, when an OBIC signal is larger than a noise component, offsetting of a noise component or the like can be disregarded.

Fifth Constitutional Example

FIG. 15 is a schematic view illustrating the fifth constitutional example. In this example, a power management circuit (PMC) C is provided in the semiconductor device 10. The power management circuit C is constituted to adjust voltages supplied from the power source $V_{DD}$ and supply the adjusted power source voltages ($V_{DD1}$ and $V_{DD2}$) to each of the blocks BR (refer to FIG. 12) of the semiconductor device 10. In such a case, in order to acquire an OBIC signal generated when the block BR corresponding to the power source voltage ($V_{DD1}$) is irradiated with the laser light L, there is a need to access a power source line $W_{DD1}$ for supplying the power source voltage ($V_{DD1}$). Hence, in this example, an opening portion 11e is formed on the rear surface 11b of the semiconductor substrate 11A reaching the power source line $W_{DD1}$ provided in the wiring layer 11B from the rear surface 11b. For example, in the opening portion 11e, an insulation portion 17 constituted of an insulator formed through FIB processing such as FIBCVD, and a pad 18 constituted of a metal formed similarly through FIB processing are disposed. A tip portion of the pad 18 on the inward side (wiring layer 11B side) is connected to the power source line $W_{DD1}$, and the surface of the pad 18 on the outward side is exposed to the opening portion 11e. The insulation portion 17 is formed to cover a surrounding part of the pad 18. On the surface of the pad 18 on the outward side, a tip of a probe PR for measuring a current flowing in the power source line $W_{DD1}$ is connected thereto. In this manner, a current flowing in the power source line $W_{DD1}$ can be measured by performing probing via the pad 18 exposed on the rear surface 11b side of the semiconductor substrate 11A with respect to the power source line $W_{DD1}$ after branching from the power management circuit C. Normally, a relatively wide power source line corresponding to the block BR is provided in an outer edge portion of the block BR (refer to FIG. 12). In this case, the opening portion 11e described above may be formed in the outer edge portion.

In addition, the first pattern image is not limited to an OBIC image. Regarding the first pattern image, an arbitrary image obtained by imaging characteristics of an electrical signal observed in response to light irradiation (light stimulation) from the rear surface 11b of the semiconductor substrate 11A can be used.

REFERENCE SIGNS LIST

1 Semiconductor inspecting device
2 Laser light source (light source)
3 Laser scanning unit (scanning unit)
4 Amplifier (measurement unit)
10 Semiconductor device
11A Semiconductor substrate
11a Main surface
11b Rear surface
11c, 11c1, 11c2 Diffusion layer
11d Insulation layer
11d1 Element isolation layer
52 First generation unit
53 Second generation unit
54 Image processing unit (processing unit)
L Laser light (light)
P1 Layout image
P2 OBIC image (first pattern image)
P4 Colored image (second pattern image)
P5 Blurred image (second pattern image)
P6 Superimposed image
T Transistor

The invention claimed is:

1. A semiconductor inspecting method comprising:
scanning a semiconductor device with light to acquire characteristic information indicative of characteristics of an electrical signal of the semiconductor device in response to irradiation with the light for each of irradiation positions of the light and to generate a first pattern image of the semiconductor device based on the characteristic information for each of the irradiation positions;
generating a second pattern image of the semiconductor device based on a layout image showing a layout of the semiconductor device and current path information indicative of a current path in the semiconductor device; and
acquiring matching information indicative of a relative relationship between the first pattern image and the layout image based on a result of positional alignment between the first pattern image and the second pattern image.

2. The semiconductor inspecting method according to claim 1,
wherein the generating the second pattern image includes:
first processing of classifying at least one of at least a part of a diffusion layer and at least a part of an element isolation layer included in the semiconductor device based on the current path information and setting a color corresponding to the classification with respect to the at least one of the at least a part of the diffusion layer and the at least a part of the element isolation layer in the layout image; and
second processing of generating the second pattern image based on a colored image generated through the first processing.

3. The semiconductor inspecting method according to claim 2,
wherein the second processing includes blurring processing with respect to the colored image.

4. The semiconductor inspecting method according to claim 2,
wherein the second processing includes:
learning conversion processing of the colored image through machine learning using training data including the colored image for learning and the first pattern image corresponding to the colored image for learning; and
generating the second pattern image by converting the colored image using the conversion processing determined through the learning.

5. The semiconductor inspecting method according to claim 1,
wherein the acquiring the matching information includes:
presenting the first pattern image and the second pattern image to a user; and
acquiring the matching information based on information indicative of a corresponding relationship between the first pattern image and the second pattern image designated by the user.

6. The semiconductor inspecting method according to claim 1,
wherein the acquiring the matching information includes:
learning processing of positional alignment between the first pattern image and the second pattern image through machine learning using training data including the first pattern image for learning, the second pattern image corresponding to the first pattern image for learning, and a matching result of the images; and
acquiring the matching information by performing positional alignment between the first pattern image and the second pattern image using the processing of positional alignment determined through the learning.

7. The semiconductor inspecting method according to claim 1 further comprising:
generating a superimposed image in which the layout image and the first pattern image are superimposed based on the matching information.

8. The semiconductor inspecting method according to claim 1 further comprising:
identifying a failure position identified through failure analysis with respect to the semiconductor device and a position on the layout image based on the matching information, or setting a position of probing with respect to the semiconductor device based on the matching information.

9. The semiconductor inspecting method according to claim 1,
wherein in generating the first pattern image, a measurement value of an optical beam induced current generated in response to irradiation of the semiconductor device with light is acquired as the characteristic information.

10. The semiconductor inspecting method according to claim 9,
wherein the semiconductor device has a semiconductor substrate having a main surface with a transistor formed thereon and a rear surface on a side opposite to the main surface, wherein in generating the first pattern image, the rear surface of the semiconductor substrate is irradiated with the light transmitted from the rear surface to the main surface, and wherein the light has an energy greater than a bandgap of a material of the semiconductor substrate.

11. The semiconductor inspecting method according to claim 9, wherein the semiconductor device has a semiconductor substrate having a main surface with a transistor formed thereon and a rear surface on a side opposite to the main surface, wherein in generating the first pattern image, the rear surface of the semiconductor substrate is irradiated with the light that is pulse light transmitted from the rear surface to the main surface, and wherein the light has an energy smaller than a bandgap of a material of the semiconductor substrate.

12. A semiconductor inspecting device comprising:
a light source;
a scanner configured to scan a semiconductor device with light from the light source;
a measurer configured to be electrically connected to the semiconductor device and measure characteristics of an electrical signal of the semiconductor device in response to irradiation with the light for each of irradiation positions of the light;
a first generator configured to generate a first pattern image of the semiconductor device based on characteristic information indicative of the characteristics of the electrical signal for each of the irradiation positions measured by the measurer;
a second generator configured to generate a second pattern image of the semiconductor device based on a layout image showing a layout of the semiconductor device and current path information indicative of a current path in the semiconductor device; and
a processor configured to acquire matching information indicative of a relative relationship between the first pattern image and the layout image based on a result of positional alignment between the first pattern image and the second pattern image.

13. The semiconductor inspecting device according to claim 12, wherein the second generator is configured to execute:
first processing of classifying at least one of at least a part of a diffusion layer and at least a part of an element isolation layer included in the semiconductor device based on the current path information and setting a color corresponding to the classification with respect to the at least one of the at least a part of the diffusion layer and the at least a part of the element isolation layer in the layout image; and
second processing of generating the second pattern image based on a colored image generated through the first processing.

14. The semiconductor inspecting device according to claim 13, wherein the second processing includes blurring processing with respect to the colored image.

15. The semiconductor inspecting device according to claim 13, wherein the second processing executes:
learning conversion processing of the colored image through machine learning using training data including the colored image for learning and the first pattern image corresponding to the colored image for learning; and
generating the second pattern image by converting the colored image using the conversion processing determined through the learning.

16. The semiconductor inspecting device according to claim 12, wherein the processor is configured to execute:
presenting the first pattern image and the second pattern image to a user; and
acquiring the matching information based on information indicative of a corresponding relationship between the first pattern image and the second pattern image designated by the user.

17. The semiconductor inspecting device according to claim 12, wherein the processor is configured to execute:
learning processing of positional alignment between the first pattern image and the second pattern image through machine learning using training data including the first pattern image for learning, the second pattern image corresponding to the first pattern image for learning, and a matching result of the images; and
acquiring the matching information by performing positional alignment between the first pattern image and the second pattern image using the processing of positional alignment determined through the learning.

18. The semiconductor inspecting device according to claim 12, wherein the processor is configured to generate a superimposed image in which the layout image and the first pattern image are superimposed based on the matching information.

19. The semiconductor inspecting device according to claim 12, wherein the processor is configured to identify a failure position identified through failure analysis with respect to the semiconductor device and a position on the layout image based on the matching information, or to set a position of probing with respect to the semiconductor device based on of the matching information.

20. The semiconductor inspecting device according to claim 12, wherein the measurer is configured to acquire a measurement value of an optical beam induced current generated in response to irradiation of the semiconductor device with light as the characteristic information.

21. The semiconductor inspecting device according to claim 20, wherein the semiconductor device has a semiconductor substrate having a main surface with a transistor formed thereon and a rear surface on a side opposite to the main surface, wherein the scanner is configured to scan the rear surface of the semiconductor substrate with the light transmitted from the rear surface to the main surface, and wherein the light has an energy greater than a bandgap of a material of the semiconductor substrate.

22. The semiconductor inspecting device according to claim 20, wherein the semiconductor device has a semiconductor substrate having a main surface with a transistor formed thereon and a rear surface on a side opposite to the main surface, wherein the scanner is configured to scan the rear surface of the semiconductor substrate with the light that is pulse light transmitted from the rear surface to the main surface, and wherein the light has an energy smaller than a bandgap of a material of the semiconductor substrate.

\* \* \* \* \*